United States Patent
Yamaguchi et al.

(10) Patent No.: US 9,111,748 B2
(45) Date of Patent: Aug. 18, 2015

(54) METHOD OF MANUFACTURING SEMICONDUCTOR DEVICE, SUBSTRATE PROCESSING APPARATUS, AND NON-TRANSITORY COMPUTER READABLE RECORDING MEDIUM

(71) Applicant: Hitachi Kokusai Electric Inc., Tokyo (JP)

(72) Inventors: Daigo Yamaguchi, Toyama (JP); Tsuyoshi Takeda, Toyama (JP); Taketoshi Sato, Toyama (JP); Hidenari Yoshida, Toyama (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 14/036,836

(22) Filed: Sep. 25, 2013

(65) Prior Publication Data

US 2014/0087565 A1 Mar. 27, 2014

(30) Foreign Application Priority Data

Sep. 26, 2012 (JP) ................................. 2012-212461
Aug. 1, 2013 (JP) ................................. 2013-160345

(51) Int. Cl.
| | | |
|---|---|---|
| H01L 21/469 | (2006.01) | |
| H01L 21/02 | (2006.01) | |
| H01L 21/67 | (2006.01) | |
| C23C 16/44 | (2006.01) | |
| C23C 16/455 | (2006.01) | |
| C23C 16/54 | (2006.01) | |

(52) U.S. Cl.
CPC ...... *H01L 21/02104* (2013.01); *C23C 16/4401* (2013.01); *C23C 16/45517* (2013.01); *C23C 16/54* (2013.01); *H01L 21/02126* (2013.01); *H01L 21/02167* (2013.01); *H01L 21/02211* (2013.01); *H01L 21/02271* (2013.01); *H01L 21/67017* (2013.01); *H01L 21/67109* (2013.01)

(58) Field of Classification Search
USPC ......................................................... 438/758
See application file for complete search history.

(56) References Cited

U.S. PATENT DOCUMENTS

2005/0098107 A1* 5/2005 Du Bois et al. ............... 118/715

FOREIGN PATENT DOCUMENTS

| JP | 1986-121734 | 7/1986 |
| JP | 2000-306904 | 11/2000 |
| JP | 2010-080657 | 4/2010 |
| JP | 2011-029284 | 2/2011 |

\* cited by examiner

*Primary Examiner* — Asok K Sarkar
(74) *Attorney, Agent, or Firm* — Edell, Shapiro & Finnan LLC

(57) ABSTRACT

A method of manufacturing a semiconductor device includes forming thin films on substrates by performing a cycle a predetermined number of times. The cycle includes: supplying a process gas into a process container and confining the gas in the container including an outer reaction tube and an inner reaction tube having a flat top inner surface at an upper end portion covering a portion of a top surface of the support arranging and supporting the substrates and including a communication section connecting an inside of the inner reaction tube to an inside of the outer reaction tube, wherein the communication section is disposed at a region other than a region horizontally encompassing a substrate arrangement region; maintaining a state where the gas is confined in the container; and exhausting the gas from the container via the communication section and a space between the inner and outer reaction tubes.

17 Claims, 45 Drawing Sheets

270

METHOD OF MANUFACTURING SEMICONDUCTOR DEVICE, SUBSTRATE PROCESSING APPARATUS, AND NON-TRANSITORY COMPUTER READABLE RECORDING MEDIUM

CROSS REFERENCE TO RELATED APPLICATIONS

This application claims foreign priority under 35 U.S.C. §119(a)-(d) to Application No. JP 2012-212461 filed on Sep. 26, 2012, and Application No. JP 2013-160345 filed on Aug. 1, 2013, the entire contents of each of which are hereby incorporated by reference.

FIELD OF THE INVENTION

The present invention relates to a method of manufacturing a semiconductor device, a substrate processing apparatus and a non-transitory computer readable recording medium, and more particularly, to a method of manufacturing a semiconductor device, which includes a process of forming a thin film by chemical vapor deposition (CVD), a substrate processing apparatus and a non-transitory computer readable recording medium that is preferably used for the process.

BACKGROUND

A substrate processing process in which a thin film is formed by chemical vapor deposition (CVD) is performed using, for example, a substrate processing apparatus that includes a process chamber configured to accommodate and process a plurality of substrates therein, a process gas supply line via which a process gas is supplied into the process chamber, and an exhaust line via which the inside of the process chamber is exhausted. In this case, a thin film is formed on the plurality of substrates by supplying the process gas into the process chamber via the process gas supply line while the inside of the process chamber in which the plurality of substrates are accommodated is exhausted using the exhaust line, and causing the process gas to pass between the plurality of substrates. (Refer to Japanese Unexamined Patent Application Publication No. 2000-306904.)

In a general thermal process, when a process gas is supplied into a heated process chamber, the process gas supplied into the process chamber is pyrolyzed and active species are thus generated in a radical state and deposited on a substrate to form a film. In a structure of a general process chamber, since a region in which the process gas is pyrolyzed is large, a plurality of types of active species that cause undesirable results involving non-uniform film thickness and non-uniform film quality within or between planes of substrates may be present among active species.

SUMMARY

It is an object of the present invention to limit a region in which a process gas is to be decomposed, to suppress generation of a plurality of types of active species, and to prevent undesirable active species from contributing to substrate processing when a thin film is formed on a substrate using a thermal process.

According to one aspect of the present invention, there is provided a method of manufacturing a semiconductor device including forming thin films on a plurality of substrates by performing a cycle a predetermined number of times, the cycle including: (a) supplying a process gas into a process container and confining the process gas in the process container in a state where the plurality of substrates arranged and supported by a support are accommodated in the process container, the process container including an outer reaction tube and an inner reaction tube disposed in the outer reaction tube, the inner reaction tube having a flat top inner surface at an upper end portion thereof covering at least a portion of a top surface of the support arranging and supporting the plurality of substrates in the inner reaction tube and including a communication section connecting an inside of the inner reaction tube to an inside of the outer reaction tube, wherein the communication section is disposed at a region other than a region horizontally encompassing a substrate arrangement region where the plurality of substrates are arranged; (b) maintaining a state where the process gas is confined in the process container; and (c) exhausting the process gas from the process container via the communication section and a space between the inner reaction tube and the outer reaction tube.

According to another aspect of the present invention, there is provided a substrate processing apparatus including: a process container including: an outer reaction tube; and an inner reaction tube disposed in the outer reaction tube, the inner reaction tube having a flat top inner surface at an upper end portion thereof covering at least a portion of a top surface of the support arranging and supporting the plurality of substrates in the inner reaction tube and including a communication section connecting an inside of the inner reaction tube to an inside of the outer reaction tube, wherein the communication section is disposed at a region other than a region horizontally encompassing a substrate arrangement region where the plurality of substrates are arranged; a process gas supply system configured to supply a process gas into the process container; an exhaust system configured to exhaust the process gas from the process container via the communication section and a space between the inner reaction tube and the outer reaction tube; and a control unit configured to control the process gas supply system and the exhaust system to form thin films on the plurality of substrates by performing a cycle a predetermined number of times, the cycle including: (a) supplying the process gas into the process container and confining the process gas in the process container in a state where the plurality of substrates arranged and supported by the support are accommodated in the process container; (b) maintaining a state where the process gas is confined in the process container; and (c) exhausting the process gas from the process container via the communication section and the space between the inner reaction tube and the outer reaction tube.

According to still another aspect of the present invention, there is provided a non-transitory computer readable recording medium storing a program that causes a computer to perform a process of forming thin films on a plurality of substrates by performing a cycle a predetermined number of times, the cycle including: (a) supplying a process gas into a process container and confining the process gas in the process container in a state where the plurality of substrates arranged and supported by a support are accommodated in the process container, the process container including an outer reaction tube and an inner reaction tube disposed in the outer reaction tube, the inner reaction tube having a flat top inner surface at an upper end portion thereof covering at least a portion of a top surface of the support arranging and supporting the plurality of substrates in the inner reaction tube and including a communication section connecting an inside of the inner reaction tube to an inside of the outer reaction tube, wherein the communication section is disposed at a region other than a region horizontally encompassing a substrate arrangement region where the plurality of substrates are arranged; (b) maintaining a state where the process gas is confined in the process container; and (c) exhausting the process gas from the process container via the communication section and a space between the inner reaction tube and the outer reaction tube.

According to the present invention, when a thin film is formed on substrates using a thermal process, uniform thickness and quality of the thin film may be achieved between and within planes of the substrates.

DETAILED DESCRIPTION

Hereinafter, exemplary embodiments of the present invention will be described with reference to the accompanying drawings.

Figure 1:
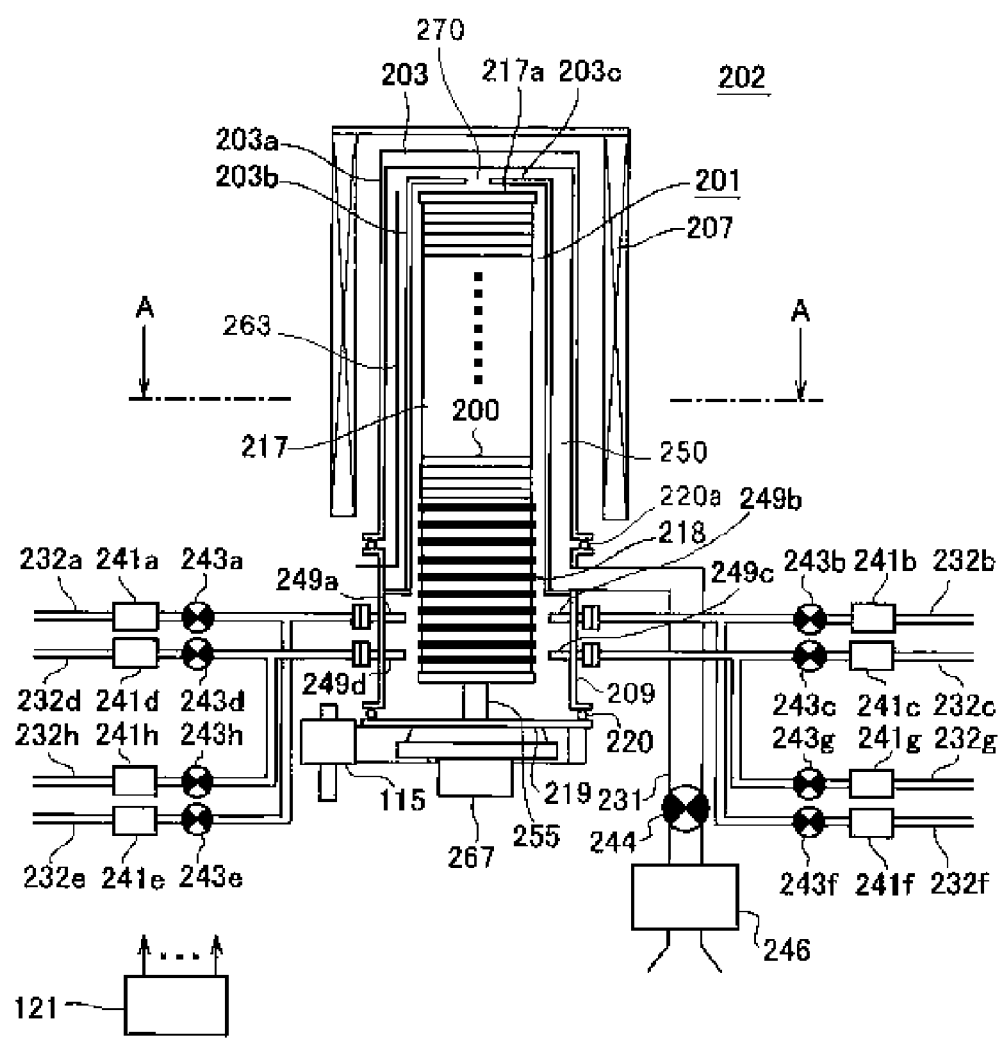
FIG. 1 is a schematic configuration diagram of a vertical process furnace of a substrate processing apparatus according to an embodiment of the present invention, in which a longitudinal cross-sectional view of a portion of the process furnace is illustrated.
Figure 2:
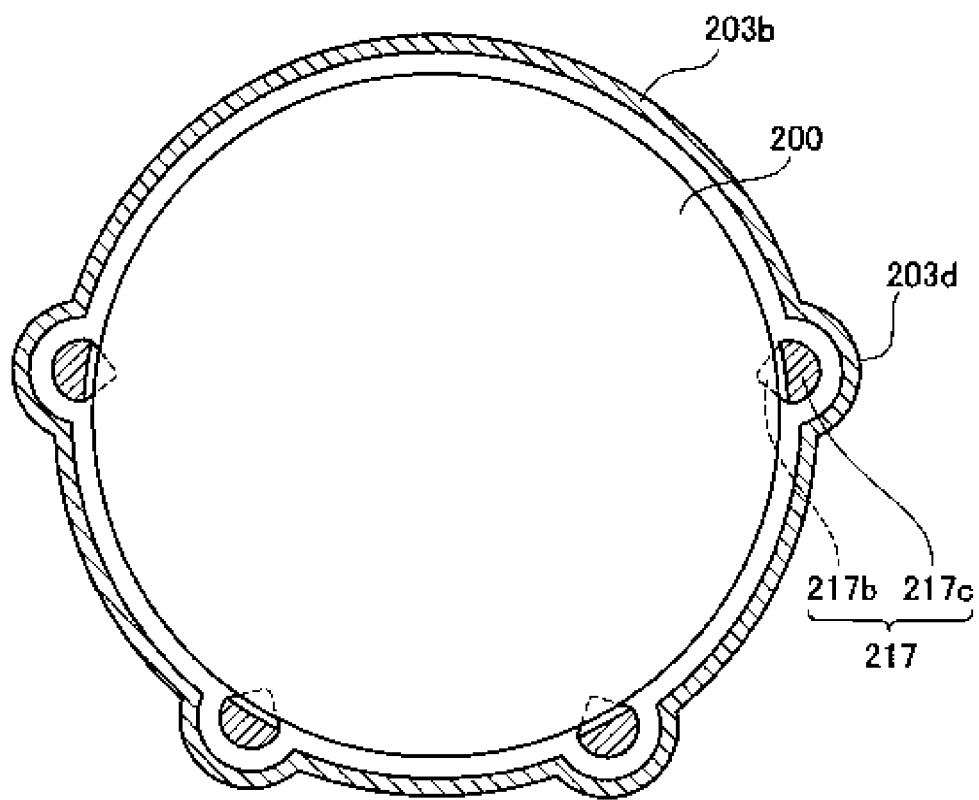
FIG. 2 is a cross-sectional view of the vertical process furnace of the substrate processing apparatus according to an embodiment of the present invention, taken along line A-A of FIG. 1.

FIG. 1 is a schematic configuration diagram of a vertical process furnace 202 of a substrate processing apparatus according to an embodiment of the present invention, in which a longitudinal cross-sectional view of a portion of the process furnace 202 is illustrated. FIG. 2 is a cross-sectional view of the vertical process furnace 202 of the substrate processing apparatus according to an embodiment of the present invention, taken along line A-A of FIG. 1. Specifically, FIG. 2 illustrates only an inner tube 203b, a boat 217 included in the process furnace 202 (which will be described below), and a wafer 200 supported by the boat 217.

As illustrated in FIG. 1, the process furnace 202 includes a heater 207 serving as a heating member (heating device). The heater 207 has a cylindrical shape and is vertically installed by being supported by a heater base (not shown) serving as a support plate. The heater 207 may also function as an activating mechanism (exciting unit) configured to activate (excite) a gas by decomposing the gas by heat, as will be described below.

At an inner side of the heater 207, a process tube 203 is provided as a reaction tube that forms a reaction container (process container) to be concentrically formed with the heater 207. The process tube 203 includes an inner tube 203b serving as an inner reaction tube, and an outer tube 203a serving as an outer reaction tube installed at an outer side of the inner tube 203b.

The inner tube 203b is formed of, for example, a heat-resistant material such as quartz ($SiO_2$), silicon carbide (SiC), etc., and has a disk shape, the upper end (upper end portion) and lower end (lower end portion) of which are open. In a hollow tubular portion of the inner tube 203b, a plurality of wafers 200 are accommodated as substrates which are targets on which a thin film is to be formed. Hereinafter, in the inner tube 203b, a region accommodating the wafers 200 is also referred to as a wafer region (substrate arrangement region).

At least a portion of a top surface 217a (ceiling plate) of the boat 217 serving as a support (which will be described below) is covered with an upper end portion 203c (ceiling portion) of the inner tube 203b. The upper end portion 203c of the inner tube 203b may also be considered as a structure that covers at least a portion of a surface of the wafer 200. The upper end portion 203c of the inner tube 203b is installed in parallel with the top surface 217a having a flat shape of the boat 217 and a surface of the wafer 200, and has at least flat inner surfaces. An outer surface of the upper end portion 203c of the inner tube 203b is also flat. The upper end portion 203c of the inner tube 203b extends from upper ends of sidewalls of the inner tube 203b toward inner sides of the inner tube 203b, and may be thus referred to as an extension unit. A communication section (opening) 270 is formed in a central portion (center portion) of the upper end portion 203c of the inner tube 203b, through which the inside of the inner tube 203b and the inside of the outer tube 203a which will be described below communicate with each other. That is, the upper end portion 203c of the inner tube 203b includes a donut-shaped (ring-shaped) plate-shaped member (plate) having an opening in a central portion thereof. Due to this shape, the upper end portion 203c of the inner tube 203b may be referred to as an orifice-shaped member (or simply 'orifice'). The communication section 270 may be formed in portion of the upper end portion 203c of the inner tube 203b other than the central portion of the upper end portion 203c, e.g., a circumferential portion of the upper end portion 203c or the like, or may be formed in a sidewall portion of the inner tube 203b. However, when the communication section 270 is formed in the sidewall portion of the inner tube 203b, the communication section 270 may be formed in a region above the wafer region and near the upper end portion 203c, or may be formed in a region that is located below the wafer region and that horizontally encompasses an insulating plate arrangement region in which a plurality of insulating plates 218 (which will be described below) are arranged.

The outer tube 203a is formed of, for example, a heat-resistant material such as quartz or SiC, has a cylindrical shape, the internal diameter of which is greater than the external diameter of the inner tube 203b, the upper end portion of which is closed, and the lower end (lower end portion) of which is open, and is formed concentrically with the inner tube 203b. The upper end portion 203c of the inner tube 203b (ceiling portion) is covered with the upper end portion (ceiling portion) of the outer tube 203a.

The upper end portion of the outer tube 203a is installed in parallel with the upper end portion 203c of the inner tube 203b, the top surface (ceiling plate) 217a of the boat 217, and a surface of the wafer 200, and has at least flat inner surfaces. That is, the inner surfaces of the upper end portion of the outer tube 203a are composed of planes. Similarly, outer surfaces of the upper end portion of the outer tube 203a have a flat shape and are composed of planes. The upper end portion of the outer tube 203a is formed to be thicker than the sidewall portion of the outer tube 203a, and is configured to maintain hardness of the outer tube 203a even when the inside of the outer tube 203a is set to a predetermined vacuum degree. The upper end portion of the outer tube 203a is thicker than the upper end portion 203c of the inner tube 203b or a sidewall portion of the inner tube 203b.

The process chamber 201 is mainly configured by the outer tube 203a and the inner tube 203b. The process chamber 201 is configured to accommodate wafers 200 such that the wafers 200 are arranged in a horizontal posture and vertically in a multistage manner by the boat 217 which will be described below.

Due to the structures of the outer tube 203a and the inner tube 203b described above, an actual volume (capacity) of the process chamber 201 may be reduced, and a region in which a process gas is pyrolyzed to generate active species is limited (minimized), thereby enabling a plurality of types of active species to be generated.

In other words, the volume (capacity) of the space between the ceiling portions of the outer tube 203a and the inner tube 203b may be set to be small by forming a flat-flat structure in which an inner surface of the upper end portion (ceiling portion) of the outer tube 203a and an outer surface of the upper end portion (ceiling portion) 203c of the inner tube 203b are formed to be flat. Thus, the actual volume (capacity) of the process chamber 201 may be set to be small and a region in which a process gas is pyrolyzed to generate active species is limited (reduced), thereby suppressing generation of a plurality of types of active species. Also, the volume (capacity) of the space between the inner surface of the upper end portion 203c of the inner tube 203b and the top surface 271a of the boat 217 may be reduced to be small by forming a flat-flat structure in which an inner surface of the upper end portion 203c of the inner tube 203b is formed to be flat and at least a portion of the flat top surface of the boat 217 is covered with the upper end portion 203c of the inner tube 203b. Thus, the actual volume (capacity) of the process chamber 201 may be reduced to be smaller, and the region in which the process gas is pyrolyzed to generate active species is more limited (reduced), thereby further suppressing generation of a plurality of types of active species.

Also, active species produced in the space between the inner surface of the upper end portion (ceiling portion) of the outer tube 203a and the outer surface of the upper end portion (ceiling portion) 203c of the inner tube 203b and the space between the inner surface of the upper end portion 203c of the inner tube 203b and the top surface 217a of the boat 217 may be easily consumed to be exhausted by reducing the volumes of the spaces. As a result, the concentration of the active species in the spaces may be appropriately reduced.

That is, the ratio of "the amount of active species consumed by contacting the surface of the space between the inner surface of the ceiling portion of the outer tube 203a and the outer surface of the ceiling portion of the inner tube 203b, such as the outer tube 203a or the inner tube 203b" to "the amount of active species produced in the space," i.e., (consumption rate/production rate), may be increased by increasing the ratio of the surface area of the space between the inner surface of the ceiling portion of the outer tube 203a and the outer surface of the ceiling portion of the inner tube 203b to the volume thereof, i.e., (surface area/volume). Similarly, the ratio of "the amount of active species consumed by contacting a surface of the space between the upper end portion 203c of the inner tube 203b and the top surface 217a of the boat 217, i.e., the surface of the inner tube 203b or the boat 217" to "the amount of active species produced in the space between the upper end portion 203c of the inner tube 203b and the top surface 217a of the boat 217," i.e., (consumption rate/production rate), may be increased by increasing the ratio of the surface area of the space between the upper end portion 203c of the inner tube 203b and the top surface 217a of the boat 217 to the volume thereof, i.e., (surface area/volume). That is, the active species produced in these spaces may be easily consumed by increasing the ratio of the surface area of each of the spaces to the volume thereof. Accordingly, the concentration of the active species in these spaces may be appropriately reduced.

Also, the distance from active species (generated as reactive species at an upper portion of the wafer 200 or between the outer tube 203a and the inner tube 203b) to the wafer 200 may be increased and the active species may be suppressed from contacting the wafer 200 by covering at least a portion of the top surface 217a (ceiling plate) of the boat 217, i.e., the upper portion of the wafer 200, with the upper end portion 203c of the inner tube 203b and forming the communication section 270 on the upper end portion 203c of the inner tube 203b.

That is, through the above configuration, active species generated in the space between the inner surface of the upper end portion 203c of the inner tube 203b and the top surface 217a of the boat 217 cannot arrive at the wafer 200 unless the active species bypasses an edge of the top surface 217a of the boat 217. Also, through the above configuration, the communication section 270 formed at the upper end portion 203c of the inner tube 203b is disposed facing the top surface 217a of the boat 217 so that the communication section 270 may be blocked by the top surface 217a of the boat 217. Thus, active species generated in the space between the outer tube 203a and the inner tube 203b cannot arrive at the wafer 200 unless the active species move along the space, pass through the communication section 270, and bypass the edge of the top surface 217a of the boat 217. As described above, the distance (path) from the active species to the wafer 200 may be increased, and the active species may be consumed to be exhausted before arriving at the wafer 200 by bypassing the active species generated at the upper portion of the wafer 200 or between the outer tube 203a and the inner tube 203b. In other words, the active species generated around these elements may be suppressed from contacting the wafer 200. In particular, when the communication section 270 is formed at a central portion of the upper end portion 203c of the inner tube 203b, a distance from the active species passing through the communication section 270 to the wafer 200 may be increased to a maximum level and the active species are easily suppressed from contacting the wafer 200.

Using the above configuration, the distribution of the concentration of active species in the process chamber 201 (particularly, in the wafer region) may be uniformized. Also, film thickness and quality may be suppressed from being influenced by active species generated at the upper portion of the wafer 200 or in the space between the outer tube 203a and the inner tube 203b. As a result, the uniformity of the thickness and quality of a thin film formed on the wafers 200 within and between planes of the wafer 200 may be improved.

Also, in the above configuration, the distance between an inner wall of a sidewall of the inner tube 203b (hereinafter referred to simply as an inner wall of the inner tube 203b) and an end portion of the wafer 200 is preferably short. For example, the distance between the inner wall of the inner tube 203b and the end portion of the wafer 200 is preferably less than or equal to the distance between adjacent wafers 200 (wafer arrangement pitch). However, as illustrated in FIG. 2, the boat 217 which will be described in detail below includes boat pillars (boat supports) 217c in which locking grooves 217b are formed to support the wafer 200. The boat pillars 217c are located outside of the wafer 200. Thus, when the distance between the inner wall of the inner tube 203b and the end portion of the wafer 200 is short, the inner wall of the inner tube 203b and the boat pillars 217c contact one another. For this reason, the distance between the inner wall of the inner tube 203b and the end portion of the wafer 200 should not be shortened any further. That is, the boat pillars 217c prevent the distance between the inner wall of the inner tube 203b and the end portion of the wafer 200 from being shortened. Thus, in order to further reduce the distance between the inner wall of the inner tube 203b and the end portion of the wafer 200, boat pillar grooves 203d serving as spaces (concavities) for avoiding the boat pillars 217c are preferably formed in locations corresponding to the boat pillars 217c on the inner wall of the inner tube 203b as illustrated in, for example, FIG. 2. FIG. 2 illustrates only the inner tube 203b, the boat 217, and the wafer 200 supported by the boat 217, for convenience of explanation.

Using this configuration, i.e., the configuration in which a concave portion for avoiding a member forming the boat 217 is formed on the inner tube 203b, the distance between the inner wall of the inner tube 203b and the end portion of the wafer 200 may be reduced to a minimum level.

As described above, by minimizing the distance between the inner wall of the inner tube 203b and the end portion of the wafer 200, an actual volume of the process chamber 201 may be reduced and a region in which active species are generated may be reduced to suppress generation of a plurality of types of active species. Due to this configuration, the thickness and quality of a film may be suppressed from being influenced more by the active species, and may be more uniformized within and between planes of the wafers 200.

The shape of the inner tube 203b including the upper end portion 203c and the sidewall portion described above may be referred to as a roughly cylindrical shape as compared with a pure cylindrical shape.

Below the outer tube 203a, a manifold 209 is provided to be formed concentrically with the outer tube 203a. The manifold 209 is formed of, for example, stainless steel (SUS) and has a cylindrical shape, the top and bottom ends of which are open. The manifold 209 is engaged with the inner tube 203b and the outer tube 203a and installed to support the inner tube 203b and the outer tube 203a. An O-ring 220a is installed as a seal member between the manifold 209 and the outer tube 203a. The process tube 203 is vertically installed since the manifold 209 is supported by the heater base. A reaction container (process container) is mainly configured by the process tube 203 and the manifold 209.

Nozzles 249a through 249d serving as gas introduction units are connected to the manifold 209 to pass through a sidewall of the manifold 209 and to communicate with the inside of the process chamber 201. Gas supply pipes 232a through 232d are connected to the nozzles 249a through 249d, respectively. As described above, four nozzles 249a through 249d and four gas supply pipes 232a through 232d are installed at the process tube 203, and configured to supply a plurality of types of process gases (here, four types of process gases) into the process chamber 201.

At the gas supply pipes 232a through 232d, mass flow controllers (MFCs) 241a through 241d which are flow rate controllers (flow rate control units) and valves 243a through 243d which are opening/closing valves are sequentially installed in an upstream direction. Also, gas supply pipes 232e through 232h configured to supply an inert gas are connected to the gas supply pipes 232a through 232d at downstream sides of the valves 243a through 243d, respectively. MFCs 241e through 241h which are flow rate controllers (flow rate control unit) and valves 243e through 243h which are opening/closing valves are sequentially installed at the gas supply pipes 232e through 232h in the upstream direction, respectively. Also, the nozzles 249a through 249d described above are connected to front ends of the gas supply pipes 232a through 232d, respectively.

A silicon-based gas, i.e., a silane-based gas, is supplied as a process gas into the process chamber 201 from the gas supply pipe 232a via the MFC 241a, the valve 243a, and the nozzle 249a.

An amine-based gas is supplied as a process gas into the process chamber 201 from the gas supply pipe 232b via the MFC 241b, the valve 243b, and the nozzle 249b.

An oxidizing gas, i.e., an oxygen-containing gas, is supplied as a process gas into the process chamber 201 from the gas supply pipe 232c via the MFC 241c, the valve 243c, and the nozzle 249c.

A nitriding gas, i.e., a nitrogen-containing gas, is supplied as a process gas into the process chamber 201 from the gas supply pipe 232d via the MFC 241d, the valve 243d, and the nozzle 249d.

For example, nitrogen ($N_2$) gas is supplied as an inert gas into the process chamber 201 from the gas supply pipes 232e through 232h via the MFCs 241e through 241h, the valves 243e through 243h, the gas supply pipes 232a through 232d, and the nozzles 249a through 249d.

When the gases described above are supplied from these gas supply pipes, a silane-based gas supply system which is a silicon-based gas supply system is mainly configured by the gas supply pipe 232a, the MFC 241a, and the valve 243a. The nozzle 249a may further be included in the silane-based gas supply system. Also, an amine-based gas supply system is configured by the gas supply pipe 232b, the MFC 241b, and the valve 243b. The nozzle 249b may further be included in the amine-based gas supply system. Also, an oxygen-containing gas supply system is configured as an oxidizing gas supply system by the gas supply pipe 232c, the MFC 241c, and the valve 243c. The nozzle 249c may further be included in the oxygen-containing gas supply system. Also, a nitrogen-containing gas supply system is configured as a nitriding gas supply system is configured by the gas supply pipe 232d, the MFC 241d, and the valve 243d. The nozzle 249d may further be included in the nitrogen-containing gas supply system.

Also, an inert gas supply system is configured by the gas supply pipes 232e through 232h, the MFCs 241e through 241h, and the valves 243e through 243h. The inert gas supply system may also act a purge gas supply system.

At least one among the silicon-based gas supply system (silane-based gas supply system), the amine-based gas supply system, the oxidizing gas supply system (oxygen-containing gas supply system), and the nitriding gas supply system (nitrogen-containing gas supply system) may be referred to simply as a process gas supply system. For example, the silicon-based gas supply system may be referred to as a process gas supply system, and the silicon-based gas supply system and the amine-based gas supply system may be referred to as a process gas supply system.

At the manifold 209, an exhaust pipe 231 configured to exhaust an atmosphere in the process chamber 201 is installed. The exhaust pipe 231 is disposed below a container-shaped space 250 formed by a gap between the inner tube 203b and the outer tube 203a, and communicates with the container-shaped space 250. A vacuum pump 246 serving as a vacuum exhaust device is connected to a downstream side opposite to a side of the exhaust pipe 231 connected to the manifold 209, via a pressure sensor 245 serving as a pressure detector (pressure detection unit) configured to detect pressure in the process chamber 201 and an auto pressure controller (APC) valve 244 serving as a pressure adjustor (pressure adjustment unit). The APC valve 244 is a valve configured to perform or suspend vacuum exhaust in the process chamber 201 by opening/closing the APC valve 244 and to adjust the pressure in the process chamber 201 by controlling the degree of opening the APC valve 244 based on pressure information detected by the pressure sensor 245, while the vacuum pump 246 is operated. An exhaust system is mainly configured by the exhaust pipe 231, the APC valve 244, and the pressure sensor 245. The vacuum pump 246 may be further included in the exhaust system.

A seal cap 219 serving as a furnace port lid is installed below the manifold 209 to air-tightly seal a low end opening in the manifold 209. The seal cap 219 abuts a lower end of the manifold 209 from a lower side in a vertical direction. The seal cap 219 is formed of a metal such as stainless steel (SUS), and has a disk shape. An 'O-ring' 220 serving as a sealing member that abuts the lower end of the manifold 209 is installed on a top surface of the seal cap 219. A rotation mechanism 267 configured to rotate the boat 217 (which will be described below) is installed at a side of the seal cap 219 opposite to the process chamber 201. A rotary shaft 255 of the rotation mechanism 267 is connected to the boat 217 (which will be described below) while passing through the seal cap 219. The rotation mechanism 267 is configured to rotate the wafers 200 by rotating the boat 217. The seal cap 219 is vertically moved by a boat elevator 115 which is a lifting mechanism vertically installed outside the reaction tube 203. The boat elevator 115 is configured to vertically move the seal cap 219 so that the boat 217 may be loaded into/unloaded from the process chamber 201. The boat elevator 115 is configured as a transfer device (transfer mechanism) that transfers the boat 217, i.e., the wafers 200, inside/outside the process chamber 201.

The boat 217 serving as a support is formed of, for example, quartz or SiC, and supports a plurality of wafers 200 in a multi-stage manner such that the plurality of wafers 200 are arranged in a horizontal posture to be concentrically formed with one another. As illustrated in FIGS. 1 and 2, the boat 217 includes the ceiling plate 217a forming the top surface of the boat 217, and a plurality of boat pillars 217c (four boat pillars 217c in the present embodiment).

The ceiling plate 217a is configured as a flat plate type member and to entirely cover an upper portion of the wafer 200, i.e., an upper portion of the wafer 200 disposed on an uppermost portion (top portion) of the wafer region. Thus, the length of a path in which active species generated on an upper portion of the wafer 200 arrive at the wafer 200 may be increased. Also, the ceiling plate 217a is formed to face the communication section 270 installed on the upper end portion 203c of the inner tube 203b, i.e., to close the communication section 270, when the boat 217 is loaded into the process chamber 201. Thus, the length of a path in which active species generated between the outer tube 203a and the inner tube 203b arrive at the wafers 200 after the active species pass through the communication section 270 may be increased and the active species may be suppressed from contacting the wafers 200. As a result, the uniformity of the thickness and quality of a thin film formed on the wafers 200 within and between planes of the wafers 200 may be improved.

On each of the boat pillars 217c, a plurality of locking grooves (slots) 217b are formed to support a plurality of wafers 200 (e.g., 25 to 200 wafers 200). The boat pillars 217c are each formed to be accommodated into the boat pillar grooves 203d formed in the inner wall of the inner tube 203b not to be in contact with the boat pillar grooves 203d. When the wafers 200 are loaded into all the locking grooves 217b, the distance between the wafer 200 disposed on the uppermost portion of the wafer region and the ceiling plate 217a is equal to the distance between adjacent wafers 200 (wafer arrangement pitch). Thus, when the boat 217 is loaded into the process chamber 201, an actual volume (capacity) of the process chamber 201 may be reduced and a region in which a process gas is pyrolyzed to generate active species is limited (reduced to a minimum), thereby suppressing generation of a plurality of types of active species. Also, a film thickness and quality may be suppressed from being influenced by the active species, and uniform film thickness and quality within and between planes of the wafers 200 may be achieved.

Below the boat 217, the insulating plates 218 formed of, for example, quartz or SiC are configured to be supported in a horizontal posture and a multi-stage manner, and to prevent heat generated from the heater 207 from being delivered to the seal cap 219. Otherwise, an insulating container configured as a container-shaped member formed of a heat-resistant material such as quartz or SiC may be installed below the boat 217, instead of the insulating plate 218. In the process chamber 201 (the inner tube 203b), a region configured to accommodate the insulating plates 218 is also referred to as an insulating plate arrangement region.

In the process tube 203, a temperature sensor 263 is installed as a temperature detector. A temperature in the process chamber 201 may have a desired temperature distribution by causing the temperature sensor 263 to control an amount of electric power to be supplied to the heater 207 based on temperature information detected by the temperature sensor 263. The temperature sensor 263 is configured in an L shape, and has a horizontal portion installed to pass through the manifold 209 and a vertical portion installed to move upward from at least one end side of the wafer region toward another end side of the wafer region.

Figure 3:
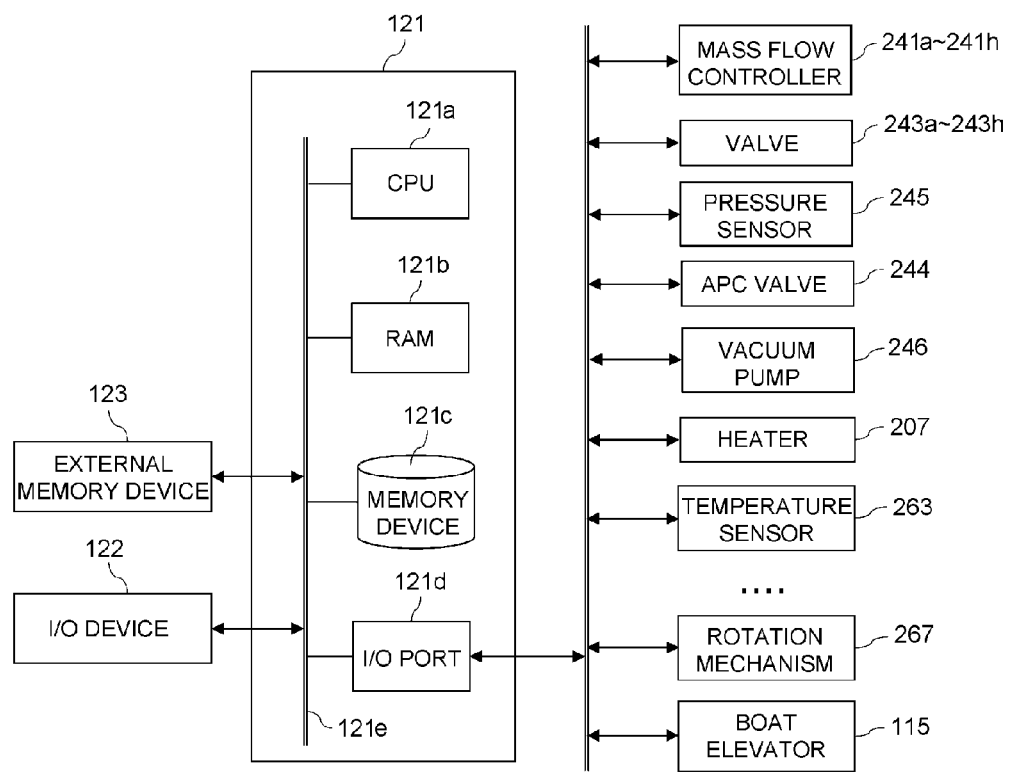
FIG. 3 is a schematic configuration diagram of a controller of the substrate processing apparatus according to an embodiment of the present invention, in which a block diagram of a control system of the controller is illustrated.

As illustrated in FIG. 3, a controller 121 which is a control unit (control member) is configured as a computer that includes a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a via an internal bus 121e. An I/O device 122 configured by, for example, a touch panel, etc., is connected to the controller 121.

The memory device 121c is configured by, for example, a flash memory, a hard disk drive (HDD), etc. In the memory device 121c, a control program controlling an operation of a substrate processing apparatus or a process recipe instructing an order or conditions of processing a substrate (which will be described below) are stored to be readable. The process recipe is obtained by combining operations of a substrate processing process (which will be described below) such that a desired result is obtained when the operations are performed by the controller 121, and acts as a program. Hereinafter, such a process recipe and a control program will be referred to collectively simply as a 'program.' Also, when the term 'program' is used in the present disclosure, it can be understood as including only a program recipe, only a control program, or both the program recipe and the control program. The RAM 121b is configured as a work area for temporarily storing a program or data read by the CPU 121a.

The I/O port 121d is connected to the MFCs 241a through 241h, the valves 243a through 243h, the pressure sensor 245, the APC valve 244, the vacuum pump 246, the heater 207, the temperature sensor 263, the rotation mechanism 267, the boat elevator 115, etc., which were described above.

The CPU 121a is configured to read and execute the control program stored in the memory device 121c, and read the process recipe from the memory device 121c according to a manipulation command received via the I/O device 122. Also, according to the read process recipe, the CPU 121a is configured to control the MFCs 241a through 241h to adjust the flow rates of various gases, control the valves 243a through 243h to be opened/closed, control the APC valve 244 to be opened/closed and to adjust pressure based on the pressure sensor 245, control the heater 207 to adjust temperature based on the temperature sensor 263, control the vacuum pump 246 to be started and stopped, control the rotation mechanism 267 to rotate the boat 217 and adjust a rotation speed of the boat 217, and control the boat elevator 115 to move the boat 217 upward/downward.

The controller 121 is not limited to a dedicated computer and may be configured as a general-purpose computer. For example, the controller 121 according to the present embodiment may be configured by preparing an external memory device 123 storing such programs, e.g., a magnetic disk (a magnetic tape, a flexible disk, a hard disk, etc.), an optical disc (a Compact Disc (CD), a Digital Versatile Disc (DVD), etc.), a magneto-optical disc (MO), or a semiconductor memory (a Universal Serial Bus (USB) memory, a memory card, etc.), and then installing the programs in a general-purpose computer using the external memory device 123. However, a method of supplying a program to a computer is not limited to using the external memory device 123. For example, a communication unit, such as the Internet or an exclusive line, may be used to supply a program to a computer without using the external memory device 123. The memory device 121c or the external memory device 123 may be configured as a non-transitory computer-readable recording medium. Hereinafter, the memory device 121c or the external memory device 123 may also be referred to collectively as simply a 'recording medium.' When the term 'recording medium' is used in the present disclosure, it may be understood as including only the memory device 121c, only the external memory device 123, or both the memory device 121c and the external memory device 123.

Next, a method of forming a thin film on a substrate using the substrate processing apparatus described above, which is a process included in a semiconductor manufacturing process, will now be described.

For example, a method of forming a film containing silicon and carbon, i.e., a SiC-based film, on the wafer 200 serving as a substrate by supplying a silicon-based gas and an amine-based gas into the process chamber 201 will now be described. Specifically, a case in which disilane ($Si_2H_6$) gas is used as the silicon-based gas, triethyl amine [$(C_2H_5)_3N$, abbreviated to: TEA] gas is used as the amine-based gas, and a SiC film is formed as the SiC-based film is formed will now be described. In the present embodiment, the SiC-based film is formed under a non-plasma atmosphere. Also, in the present embodiment, a semiconductor silicon wafer is used as the wafer 200, and the formation of the SiC-based film is performed as a process included in a semiconductor device manufacturing process. The SiC-based film such as a SiC film is an insulating film having high etching and oxidation resistances and is preferably used around a transistor gate or in a wire structure.

In the present disclosure, the term 'SiC-based film' means a film including at least silicon (Si) and carbon (C), and may be a silicon carbide (SiC) film. However, examples of the SiC-based film may further include a silicon oxycarbide (SiOC) film, a silicon carbonitride (SiCN) film, a silicon oxycarbonitride film (SiOCN) film, etc.

When the term 'wafer' is used in the present disclosure, it should be understood as either the wafer itself, or a stacked structure (assembly) including the wafer and a layer/film formed on the wafer (i.e., the wafer having the layer/film formed thereon). Also, when the expression 'surface of the wafer' is used in the present disclosure, it should be understood as either a surface (exposed surface) of the wafer itself, or a surface of a layer/film formed on the wafer, i.e., an uppermost surface of the wafer which is a stacked structure.

Thus, in the present disclosure, the expression 'specific gas is supplied to a wafer' should be understood to mean that the specific gas is directly supplied onto a surface (exposed surface) of the wafer or that the specific gas is supplied onto a surface of a layer/film on the wafer, i.e., the uppermost surface of the wafer which is a stacked structure. Also, in the present disclosure, the expression 'a layer (or film) is formed on the wafer' should be understood to mean that the layer (or film) is directly formed on a surface (exposed surface) of the wafer itself, or that the layer (or film) is formed on a layer/film on the wafer, i.e., on the uppermost surface of the wafer which is the stacked structure.

Also, in the present disclosure, the term 'substrate' has the same meaning as the term 'wafer.' Thus, the term 'wafer' may be interchangeable with the term 'substrate.'

An example of a method of forming a SiC-based film will now be described in detail.

A plurality of wafers 200 are placed on the boat 217 (wafer charging). In this case, the plurality of wafers 200 are placed such that unoccupied slots are not present in all regions of a wafer region. Thus, during substrate processing, an actual volume (capacity) of the process chamber 201 may be reduced and a region in which a process gas is pyrolyzed to generate active species may be limited (minimized), thereby suppressing generation of a plurality of types of active species. Also, the thickness and quality of a film may be suppressed from being influenced by the active species, and may be uniformly achieved within and between planes of the plurality of wafers 200. In particular, when the plurality of wafers 200 are placed such that unoccupied slots are not present in at least a portion adjacent to the communication section 270 of the wafer region (a top portion of the wafer region in the present embodiment), the volume (capacity) of the region adjacent to the communication section 270 may be reduced and active species may be suppressed from being generated in the vicinity of the communication section 270. As a result, the thickness and quality of a film formed on a wafer 200 disposed adjacent to the communication section 270 may be appropriately suppressed from being influenced by the active species.

Then, as illustrated in FIG. 1, the boat 217 supporting the plurality of wafers 200 is lifted by the boat elevator 115 to be loaded into the process chamber 201 (boat loading), and the plurality of wafers 200 are thus accommodated in the process chamber 201. In this state, the seal cap 219 air-tightly seals a lower end of a process container, i.e., the manifold 209, via the O-ring 220.

Then, while the vacuum pump 246 is operated, the APC valve 244 is gradually opened to a full extent, and the inside of the process chamber 201 is vacuum-exhausted by the vacuum pump 246 such that a base pressure (degree of vacuum) in the process chamber 201 becomes 1 Pa or less. The vacuum pump 246 is continuously operated at least until processing of the wafers 200 is completed. By rotating the boat 217 using the rotation mechanism 267, the wafers 200 are rotated (wafer rotation), and are preferably rotated such that the number of rotations thereof is maintained constant, for example, within a range of 1 rpm to 10 rpm. The boat 217 and the wafer 200 are continuously rotated by the rotation mechanism 267 at least until processing of the wafers 200 is completed. The inside of the process chamber 201 is set to a desired temperature by heating the inside of the process chamber 201 by the heater 207 so that the wafers 200 may be maintained at a desired temperature (and preferably, at a temperature that falls within, for example, a range of 350° C. to 450° C.). In this case, the state of supplying electric power to the heater 207 is feedback-controlled based on temperature information detected by the temperature sensor 263 so that the inside of the process chamber 201 may have a desired temperature distribution (temperature adjustment). The inside of the process chamber 201 is continuously heated by the heater 207 at least until processing of the wafers 200 is completed.

Then, nitrogen purging is performed for several minutes under an arbitrary pressure by preferably supplying several liters of nitrogen ($N_2$) gas per minute into the process chamber 201 from the gas supply pipes 232e and 232f via the MFCs 241e and 241f, the valves 243e and 243f, the gas supply pipes 232a and 232b, and the nozzles 249a and 249b. Then, the supply of the nitrogen ($N_2$) gas is suspended and the nitrogen purging is completed.

Then, the inside of the process chamber 201 is vacuum-exhausted by the vacuum pump 246 while the APC valve 244 is fully opened, in which a base pressure in the process chamber 201 is preferably set to, for example, 1 Pa or less. When the pressure in the process chamber 201 becomes 1 Pa or less, the APC valve 244 is completely closed and gas confining is started. In this case, the APC valve 244 may not be completely closed and may be slightly opened.

The wafers 200 are maintained at a desired temperature (and preferably, a desired temperature that falls within a range, for example, of 350° C. to 450° C.), are continuously rotated at a desired speed of rotation (and preferably, a desired speed of rotation that falls within a range of, for example, 1 rpm to 10 rpm), the APC valve 244 is completely closed, and disilane ($Si_2H_6$) gas is introduced as a silicon-based gas into the process chamber 201 from the gas supply pipe 232a via the MFC 241a, the valve 243a, and the nozzle 249a. At the same time, triethylamine (TEA) gas is introduced as an amine-based gas into the process chamber 201 from the gas supply pipe 232b via the MFC 241b, the valve 243b, and the nozzle 249b. Through the above manipulation, confining of the $Si_2H_6$ gas and the TEA gas in the process chamber 201 is started (process A). The TEA gas is preferably introduced at a desired flow rate that falls within a range, for example, of 0.1 slm to 2 slm, and the $Si_2H_6$ gas is preferably introduced at a desired flow rate that falls within a range, for example, of 0.05 slm to 0.5 slm. The duration for which the TEA gas is supplied is preferably a time period that falls within a range, for example, of 1 to 60 seconds, and the duration for which the $Si_2H_6$ gas is supplied is preferably a time period that falls within a range, for example, of 1 to 60 seconds. Also, the $Si_2H_6$ gas and the TEA gas are confined in the process chamber 201 preferably under a desired pressure that falls within a range, for example, of 100 to 2,000 Pa.

Then, the supply of the $Si_2H_6$ gas and the TEA gas into the process chamber 201 is suspended, and the state in which the $Si_2H_6$ gas and the TEA gas are confined in the inside of the process chamber 201 is maintained while the APC valve 244 is completely closed (process B).

In this case, in the process chamber 201, the $Si_2H_6$ gas and the TEA gas are pyrolyzed to generate active species. However, as described above, the volume (capacity) of the space between the ceiling portions of the outer tube 203a and the inner tube 203b is reduced using the flat-flat structure in which the inner surface of the ceiling portion of the outer tube 203a and the outer surface of the ceiling portion of the inner tube 203b are formed to be flat. Thus, the actual volume (capacity) of the process chamber 201 may be small, and a region in which the $Si_2H_6$ gas and the TEA gas are pyrolyzed to generate active species may be limited (reduced). As a result, a plurality of types of active species may be suppressed from being generated. Also, when the space between these ceiling portions is formed such that the ratio of the surface area to the volume is high, active species generated in this space are easily consumed in the space, and the concentration of the active species in the space may be appropriately lowered. Accordingly, the active species may have a uniform concentration distribution in the inside of the process chamber 201, and particularly, in the wafer region.

Also, as described above, the volume (capacity) of the space between the upper end portion 203c of the inner tube 203b and the top surface 217a of the boat 217 is reduced by using the flat-flat structure in which the inner surface of the upper end portion 203c of the inner tube 203b is formed to be flat and at least a portion of the flat top surface 217a of the boat 217 is covered with the upper end portion 203c of the inner tube 203b. Thus, the actual volume (capacity) of the process chamber 201 may be set to be lower, and the region in which the $Si_2H_6$ gas and the TEA gas are pyrolyzed to generate active species may be more limited (reduced). As a result, generation of a plurality of types of active species may be more suppressed. Furthermore, when the space between the upper end portion 203c of the inner tube 203b and the top surface 217a of the boat 217 is set such that the ratio of the surface area to the volume is high, active species generated in the space are easily consumed in the space and the concentration of the active species in the space may be appropriately reduced. As a result, the concentration distribution of the active species in the process chamber 201, and particularly in the wafer region, may be more uniformized.

Also, as described above, the length of a path in which active species generated on the upper portion of the wafer 200 or between the outer tube 203a and the inner tube 203b arrive at the wafer 200 may be increased using a structure in which the upper end portion 203c of the inner tube 203b covers at least a portion of the top surface (ceiling plate) 217a of the boat 217, i.e., an upper portion of the wafer 200, and the communication section 270 is formed on the upper end portion 203c of the inner tube 203b. As a result, the active species generated on the upper portion of the wafer 200 or between the outer tube 203a and the inner tube 203b may be suppressed from contacting the wafer 200. In particular, when the communication section 270 is formed on a central portion of the upper end portion 203c of the inner tube 203b, the length of a path in which the active species passing through the communication section 270 arrive at the wafer 200 may be maximized and the active species are easily suppressed from contacting the wafer 200.

Also, as described above, by forming a sidewall portion of the inner tube 203b not to be in contact with the members that constitute the boat 217, the distance between the inner wall of the sidewall portion of the inner tube 203b and an end portion of the wafer 200 is reduced to a lower limit and an actual volume (capacity) of the process chamber 201 is more reduced. Thus, a region in which the $Si_2H_6$ gas and the TEA gas are pyrolyzed to generate active species may be more limited (reduced). Accordingly, generation of a plurality of types of active species may be further suppressed.

As described above, when a film is formed while process gases such as the $Si_2H_6$ gas and the TEA gas are confined in the process chamber 201, the thickness and quality of the film may be suppressed from being influenced by active species and may be uniformized within and between planes of the wafers 200 by using the process chamber 201 including the outer tube 203a and the inner tube 203b having the structures described above. It has been revealed that the above effects obtained when the outer tube 203a and the inner tube 203b described above are used are remarkably high particularly when a film forming process including a process of maintaining the state in which process gases are confined in the process chamber 201 for a predetermined time is performed as in the present embodiment.

In order to reduce a region in which a process gas is decomposed, only the outer tube 203a may be used as the process tube 203 without using the inner tube 203b and a volume (capacity) of the outer tube 203a may be set to a necessary minimum level. That is, both the distances between a sidewall portion of the outer tube 203a and a sidewall portion of the boat 217 and between an upper end portion of the outer tube 203a and an upper end portion of the boat 217 may be reduced to necessary minimum levels. Here, the necessary minimum level means a range that does not cause difficulties in performing manufacture of a semiconductor device and substrate processing and in handling a substrate processing apparatus. Also, the region in which a process gas is decomposed may be reduced by forming capacities such as convex portions (e.g., projections or ribs), grooves, or holes in an inner surface of the outer tube 203a or the inner tube 203b so that the inner surface of the outer tube 203a or the inner tube 203b may have a concave-convex structure.

In the process A or both the processes A and B, the APC valve 244 may not be completely closed (i.e., may be slightly opened) to slightly exhaust the $Si_2H_6$ gas and the TEA gas so that a slight flow of the gases may be formed. In this case, in the process A or both the processes A and B, the $Si_2H_6$ gas and the TEA gas are exhausted from the process chamber 201 while the $Si_2H_6$ gas and the TEA gas are supplied into the process chamber 201. In this case, the exhaust rate of the $Si_2H_6$ gas and the TEA gas from the process chamber 201 may be maintained to be lower than the supply rate of the $Si_2H_6$ gas and the TEA gas into the process chamber 201 so that the $Si_2H_6$ gas and the TEA gas may be slightly exhausted. In other words, in the process A of both the processes A and B, the $Si_2H_6$ gas and the TEA gas may be slightly exhausted in a state in which a total exhaust rate of the gases exhausted from the process chamber 201 [a total gas exhaust rate (exhaust flow rate or volume flow rate) per unit time under a predetermined pressure] is maintained to be lower than a total supply rate of the gases supplied into the process chamber 201 [a total gas supply rate (supply flow rate or volume flow rate) per unit time under the predetermined pressure]. In this case, in the process A, the $Si_2H_6$ gas and the TEA gas are exhausted from the process chamber 201 while the $Si_2H_6$ gas and the TEA gas are supplied into the process chamber 201, and the exhaust rate of the $Si_2H_6$ gas and the TEA gas from the process chamber 201 is set to be lower than the supply rate of the $Si_2H_6$ gas and the TEA gas into the process chamber 201, and this state is maintained in the process B.

As described above, even if gases supplied into the process chamber 201 are slightly exhausted, a gas confining state may actually be formed similar to when the APC valve 244 is completely closed. Thus, in the present disclosure, a state in which gases supplied into the process chamber 201 are slightly exhausted is considered as being included in the gas confining state. That is, in the present disclosure, the term 'gas confining' should be understood as including not only a case in which the APC valve 244 is completely closed and exhausting of the inside of the process chamber 201 is suspended but also a case in which the APC valve 244 is not completely closed and is slightly opened to maintain a state in which an exhaust rate of gases supplied into the process chamber 201 from the process chamber 201 is lower than a supply rate of gases supplied into the process chamber 201 and the gases supplied into the process chamber 201 are slightly exhausted.

After the processes A and B are performed a predetermined number of times, the APC valve 244 is completely opened to rapidly exhaust the inside of the process chamber 201 (process C). In this case, the $Si_2H_6$ gas or the TEA gas (that does not react or contributes when a film is formed) or byproducts remaining in the process chamber 201 are exhausted from the exhaust pipe 231 starting from the process chamber 201, via the communication section 270 (opening) in the upper end portion 203c of the inner tube 203b and the container-shaped space 250 between the inner tube 203b and the outer tube 203a.

Figure 4:
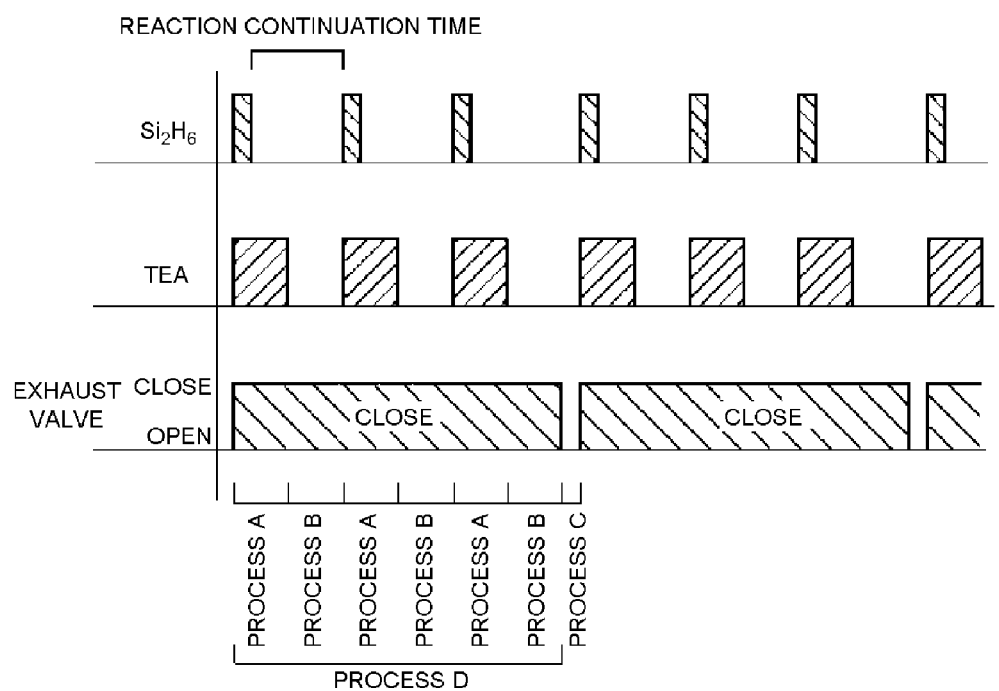
FIG. 4 is a diagram illustrating a sequence of a film-forming process according to an embodiment of the present invention.

A cycle including the processes A, B, and C, i.e., a cycle including a process (process D) of performing the processes A and B a predetermined number of times and the process C, is performed a predetermined number of times until a SiC film is formed to a desired thickness on the wafer 200. An example of a sequence of the cycle according to the present embodiment is illustrated in FIG. 4.

Then, for example, several liters of nitrogen ($N_2$) gas per minute is preferably supplied into the process chamber 201 from the gas supply pipes 232e and 232f via the MFCs 241e and 241f, the valves 243e and 243f, the gas supply pipes 232a and 232b, and the nozzles 249a and 249b, nitrogen purging is preferably performed, for example, for several minutes under an arbitrary pressure, the supply of the nitrogen gas is suspended, and the nitrogen purging is then completed.

Then, the rotation of the boat 217 by the rotation mechanism 267 is suspended, the APC valve 244 is closed, and for example, several liters of nitrogen ($N_2$) gas is preferably supplied into the process chamber 201 from the gas supply pipes 232e and 232f via the MFCs 241e and 241f, the valves 243e and 243f, the gas supply pipes 232a and 232b, and the nozzles 249a and 249b, until the pressure in the process chamber 201 becomes equal to atmospheric pressure (atmospheric pressure recovery).

The boat 217 supporting the wafers 200 on which forming of a film is completed is unloaded from the process chamber 201 by the boat elevator 115 (boat unloading). Thereafter, the plurality of processed wafers 200 are picked out of the boat 217.

In the present embodiment described above, as illustrated in FIG. 4, the process of alternately performing the process of supplying the $Si_2H_6$ gas and the TEA gas into the process chamber 201 and confining these gases in the gas process chamber 201 (process A) and the process of maintaining the state in which the $Si_2H_6$ gas and the TEA gas are confined in the process chamber 201 (process B) a plurality of times (for example, three times) (process D), and the process of exhausting the inside of the process chamber 201 (process C) are alternately and repeatedly performed a plurality of times. That is, in the present embodiment, a cycle including the process D of performing a cycle including the process A and the process B in a plurality of cycles (for example, three cycles), and the process C is repeatedly performed in a plurality of cycles.

Although in the present embodiment, the process C is performed once whenever the cycle including the process A and the process B is performed in three cycles, the process C may be performed whenever the cycle of the process A and the process B is performed in one cycle. That is, a process of alternately performing the process A and the process B once and the process C may be alternately and repeatedly performed a plurality of times. In this case, the cycle including the processes A, B, and C is repeatedly performed a plurality of times.

Also, the process C may be performed whenever the cycle including the process A and the process B is performed once, and a supply rate of the $Si_2H_6$ gas and the TEA gas supplied once in the process A may be set to be higher than a supply rate of the $Si_2H_6$ gas and the TEA gas supplied once in the present embodiment (for example, to be three times the supply rate of the $Si_2H_6$ gas and the TEA gas supplied once in the process A in the present embodiment or to be the same as when the cycle including the process A and the process B is performed in three cycles). However, in this case, since large amounts of gases are supplied when the gases are supplied once, a film forming speed increases but the pressure in the process chamber 201 may sharply increase, thereby degrading uniformity of the thickness of a film formed within planes of the wafers 200 or degrading step coverage.

Thus, when the process C is performed whenever the cycle including the process A and the process B is performed once and the supply rate of the $Si_2H_6$ gas and the TEA gas supplied once in the process A is set to be low (e.g., to be less than or equal to the supply rate of the $Si_2H_6$ gas and the TEA gas supplied once in the process A in the present embodiment), the uniformity of the thickness of the film within the planes of the wafers 200 or the step coverage may be improved but the film forming speed decreases.

In the present embodiment, the process C is performed once whenever the cycle including the process A and the process B is performed in three cycles. That is, since each of the $Si_2H_6$ gas and the TEA gas is divided and supplied a plurality of times (e.g., three times) while the APC valve 244 is completely closed, the pressure in the process chamber 201 is gradually increased in a multistage manner (three-step manner in this case). In the first step (first cycle), the pressure in the process chamber 201 and a film forming rate may be lower than in the other steps but the uniformity of the thickness of a film formed within the planes of the wafers 200 or step coverage may be better than in the other steps. In contrast, in the third step (third cycle), the pressure in the process chamber 201 and the film forming rate may be better than in the other steps but the uniformity of the thickness of the film formed within the planes of the wafers 200 or step coverage may be lower than in the other steps. Properties in the second step (second cycle) are in the middle of those of the first step (first cycle) and those of the third step (third cycle).

However, when the pressure in the process chamber 201 is increased in the multistage manner (e.g., three steps) as in the present embodiment, a film having a uniform thickness within the planes of the wafers 200 or having high step coverage is formed in the first step (first cycle) and films are formed in the second and third steps using the film having the uniform thickness or the high step coverage as an underlying film. When the films are formed in the second and third steps, they are influenced by the underlying film. Thereafter, films having a uniform thickness within the planes of the wafers 200 or having high step coverage may be formed. As described above, when the pressure in the process chamber 201 is increased in the multistage manner, an initial layer having a uniform thickness within the planes of the wafers 200 or having high step coverage may be formed in an initial stage, and the film forming rate may then be increased while securing either thickness uniformity of a film within the planes of the wafers 200 or high step coverage.

In the present embodiment, although the duration of supplying the TEA gas is set to be longer than the duration of supplying the $Si_2H_6$ gas as illustrated in FIG. 4, the duration of supplying the TEA gas may be set to be less than or equal to the duration of supplying the $Si_2H_6$ gas. However, it is preferable that the duration of supplying the TEA gas be set to be equal to the duration of supplying the $Si_2H_6$ gas.

According to the present embodiment, in the process A in which the $Si_2H_6$ gas and the TEA gas are supplied and confined in the process chamber 201, the $Si_2H_6$ gas and the TEA gas are supplied into the heated process chamber 201 so that the $Si_2H_6$ gas and the TEA gas may be thermally decomposed in the heated process chamber 201. That is, a thermal gas-phase decomposition reaction is caused. In the process B as in the process A, the $Si_2H_6$ gas and the TEA gas supplied into the process chamber 201 is thermally decomposed.

By thermally decomposing the $Si_2H_6$ gas, a material including active species, e.g., $(SiH_3+SiH_3)$, $(Si_2H_4+H_2)$, or $(SiH_4+SiH_2)$, is generated. Also, by thermally decomposing the TEA $[(C_2H_5)_3N]$ gas, a material including active species, e.g., $((C_2H_5)_2N+C_2H_5)$, $(C_2H_5N+2C_2H_5)$, $(N+3C_2H_5)$, is generated. These materials are representative examples of materials that mainly contribute to a reaction occurring when a SiC film is formed on the wafer 200.

In order to thermally decompose the $Si_2H_6$ gas and the TEA gas, in the process A in which the $Si_2H_6$ gas and the TEA gas are supplied and confined in the process chamber 201, the pressure in the process chamber 201 is preferably set to fall within a range of 100 to 2,000 Pa by supplying the $Si_2H_6$ gas and the TEA gas into the process chamber 201. Also, the temperature of the heater 207 is preferably set such that the temperature of the wafer 200 falls within a range of 350 to 450° C. $N_2$ gas may be supplied as an inert gas into the process chamber 201 from the gas supply pipes 232e and 232f. A rare gas such as Ar gas, He gas, Ne gas, or Xe gas may be used as the inert gas, instead of the $N_2$ gas.

When the temperature of the wafer 200 is less than 350° C., the $Si_2H_6$ gas is not thermally decomposed and the TEA gas does not react with a thermally decomposed material, and the SiC film is not thus formed. When the temperature of the wafer 200 is greater than 450° C., the content of nitrogen (N) remaining in the SiC film becomes greater than that of impurities and the nitrogen (N) thus acts as a component to form a film. Thus, the SiC film is prevented from being formed (that is, a SiCN film is formed rather than the SiC film). Also, when the temperature of the wafer 200 is greater than 450° C., a gas-phase reaction becomes excessively strong, thereby preventing the uniformity of the thickness of a film within the planes of the wafers 200 from being secured. Accordingly, the temperature of the wafer 200 is preferably set to fall within a range of 350 to 450° C.

When the pressure in the process chamber 201 is less than 100 Pa, a material obtained by thermally decomposing the $Si_2H_6$ gas and a material obtained by thermally decomposing the TEA gas are difficult to react with each other. When the pressure in the process chamber 201 is greater than 2,000 Pa, the duration of exhausting the process chamber 201 increases in the process C, thereby lowering the throughput. Also, when the pressure in the process chamber 201 is greater than 2,000 Pa, the content of nitrogen (N) remaining in the SiC film becomes greater than that of impurities therein and the nitrogen (N) thus acts as a component to form a film. Thus, the SiC film is prevented from being formed (that is, a SiCN film is formed rather than the SiC film). Also, a gas-phase reaction becomes excessively strong, thereby preventing the uniformity of the thickness of a film within the planes of the wafers 200 from being secured. Accordingly, the pressure in the wafer 200 is preferably set to fall within a range of 100 to 2,000 Pa.

When the supply flow rate of the $Si_2H_6$ gas into the process chamber 201 is less than 50 sccm under such an atmosphere (condition), the film forming rate is extremely degraded. When the supply flow rate of the $Si_2H_6$ gas into the process chamber 201 is greater than 500 sccm, the content of carbon (C) in the SiC film decreases. Thus, the supply flow rate of the $Si_2H_6$ gas is preferably set to fall within a range of 50 to 500 sccm (0.05 to 0.5 slm).

Also, it is preferable that the duration of supplying the $Si_2H_6$ gas be set to be as short as possible and a reaction continuation time thereof (the duration of suspending the $Si_2H_6$ gas) be set to be as long as possible. That is, an appropriate amount of the $Si_2H_6$ gas is preferably supplied for a short time. However, when the duration of supplying the $Si_2H_6$ gas is set to be less than one second, valve control is difficult. Thus, the duration of supplying the $Si_2H_6$ gas is preferably set to fall within a range of 1 to 60 seconds.

When the supply flow rate of the TEA gas into the process chamber 201 is less than 100 sccm under such an atmosphere (condition), the content of carbon (C) in the SiC film extremely decreases. Also, when the supply flow rate of the TEA gas into the process chamber 201 is greater than 2,000 sccm, the amount of the TEA gas that does not contribute to a reaction increases and is thus wasted. Thus, the supply flow rate of the TEA gas is preferably set to fall within a range of 100 to 2,000 sccm (0.1 to 2 slm).

It is preferable that the duration of supplying the TEA gas be set to be as short as possible and a reaction continuation time thereof be set to be as long as possible. That is, an appropriate amount of the TEA gas is preferably supplied for a short time. However, when the duration of supplying the TEA gas is set to be less than one second, valve control is difficult. Thus, the duration of supplying the TEA gas is preferably set to fall within a range of 1 to 60 seconds.

In the process B in which the supply of the $Si_2H_6$ gas and the TEA gas into the process chamber 201 is suspended and the state in which the $Si_2H_6$ gas and the TEA gas are confined in the process chamber 201 is maintained, materials obtained when the $Si_2H_6$ gas and the TEA gas are thermally decomposed in the process chamber 201 by supplying the $Si_2H_6$ gas and the TEA gas into the heated process chamber 201 are reacted with each other. That is, a material such as ($SiH_3$+$SiH_3$), ($Si_2H_4$+$H_2$), or ($SiH_4$+$SiH_2$) which is obtained by thermally decomposing the $Si_2H_6$ gas and a material such as $(C_2H_5)_2N+C_2H_5$), ($C_2H_5N+2C_2H_5$), ($N+3C_2H_5$) which is obtained by thermally decomposing the TEA gas are reacted with each other. Most such reactions are gas-phase reactions but surface reactions may slightly occur. Such a reaction occurs in the process A and is maintained in the process B. Through the reaction, the SiC film is formed on the wafer 200.

Since the $Si_2H_6$ gas and the TEA gas are difficult to react with each other and have a very slow reaction rate (i.e., they need a time to react with each other), the SiC film may be formed by maintaining the state in which the $Si_2H_6$ gas and the TEA gas are confined in the process chamber 201 and spending a time needed to perform the reaction so as to generate the reaction.

In this case, the pressure in the process chamber 201 is preferably maintained to fall within a range of 100 to 2,000 Pa. Also, in this case, the temperature of the heater 207 is preferably set such that the temperature of the wafer 200 falls within a range of 350 to 450° C. That is, the pressure in the process chamber 201 and the temperature of the heater 207 are maintained to fall within the ranges as in the process A.

The duration of suspending the supply of the $Si_2H_6$ gas is preferably set to fall within a range, for example, of 5 to 500 seconds. When the duration of suspending the supply of the $Si_2H_6$ gas is set to be less than five minutes, materials obtained by thermally decomposing the $Si_2H_6$ gas and the TEA gas do not completely react with each other. When this reaction proceeds to a certain degree, the amount of the materials obtained by thermally decomposing the $Si_2H_6$ gas and the TEA gas decreases and the efficiency of the reaction is lowered even if the reaction occurs. Even if this state is maintained, a film is continuously formed in a state in which the film forming rate is lowered. That is, when the duration of suspending the supply of the $Si_2H_6$ gas is excessively long, the throughput is lowered. Accordingly, the duration of suspending the supply of the $Si_2H_6$ gas is preferably set to fall within a range of 5 to 500 seconds.

It was revealed that a cycle rate of a SiC film formed according to the present embodiment [film forming rate per one cycle (cycle including the process A and the process B)] was 0.01 to 0.5 nm/cycle, and a film having an arbitrary thickness was obtained by controlling the number of cycles. For example, the thickness of the SiC film when an etch stopper is used may be in a range of 100 to 500 Å (10 to 50 nm), and may be achieved by performing the cycle described above in, for example, 20 to 5000 cycles.

In the present embodiment, since the $Si_2H_6$ gas and the TEA gas are supplied and confined in the process chamber 201, the efficiency of a gas-phase reaction may be increased even when the $Si_2H_6$ gas and the TEA gas that are difficult to react in a low-temperature region are used, and the efficiency of film forming (consumption of the $Si_2H_6$ gas and the TEA gas, a film forming rate, etc.) may be improved.

According to this method, the concentration of carbon (C) in the SiC film may be controlled to be in a range, for example, of 1 to 40% by adjusting the duration of maintaining the state in which the $Si_2H_6$ gas and the TEA gas are confined in the process chamber 201. That is, the concentration of carbon (C) in the SiC film may be controlled by adjusting the duration of suspending the supply of the $Si_2H_6$ gas and the TEA gas, and particularly, the duration of suspending the supply of the $Si_2H_6$ gas. In a film forming process using a thermal process in a low-temperature region according to the present embodiment, it was revealed that the concentration of carbon (C) in the SiC film was limited to 40% and could not exceed 40%. A relative dielectric constant k of the SiC film may be reduced and an etching resistance of the SiC film may be increased by controlling the concentration of carbon (C) in the SiC film and increasing the concentration of carbon (C) in the SiC film.

In the present embodiment, an example of forming a SiC film as a SiC-based film has been described above. However, the present invention is not limited thereto, and nitrogen (N) contained in an amine-based gas may be included in a film and a SiCN film may be formed as a SiC-based film by increasing, for example, the temperature of the wafer 200 and the pressure in the process chamber 201.

Also, in the present embodiment, an example of forming a SiC film as a SiC-based film has been described above. However, the present invention is not limited thereto, and for example, at least one film among a SiCN film, a SiOC film, and a SiOCN film which are SiC-based films may be formed by performing the process B, and a process of supplying a nitrogen-containing gas and/or a process of supplying an oxygen-containing gas during the duration of suspending the supply of the $Si_2H_6$ gas and the TEA gas.

Figure 5:
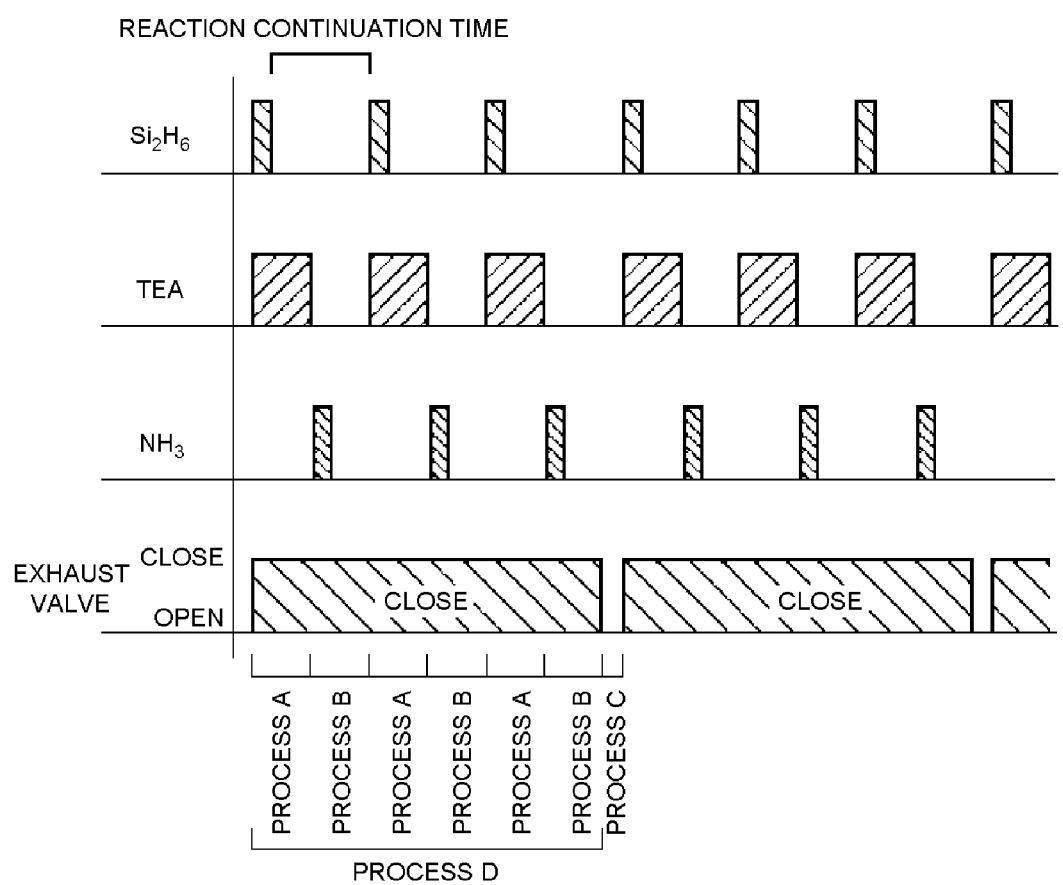
FIG. 5 is a diagram illustrating a sequence of a film-forming process according to another embodiment of the present invention.

For example, as illustrated in FIG. 5, in the process B, SiCN film may be formed as a SiC-based film by performing a process of supplying, for example, $NH_3$ gas as a nitriding gas, i.e., a nitrogen-containing gas.

Figure 6:
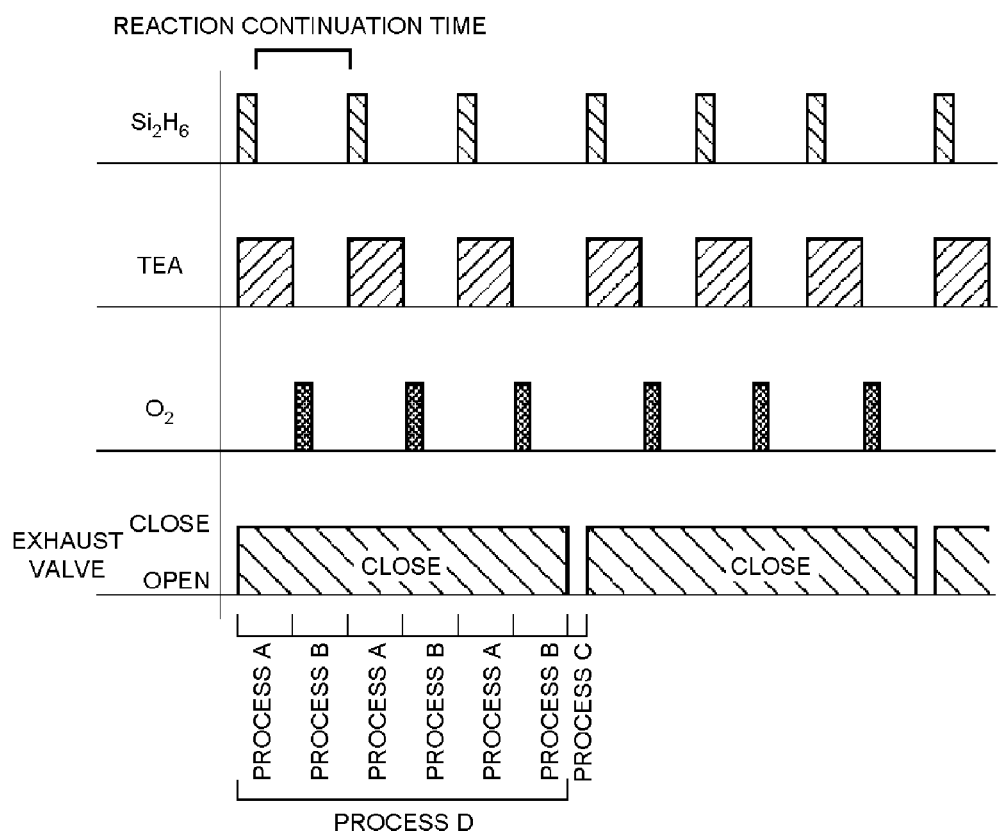
FIG. 6 is a diagram illustrating a sequence of a film-forming process according to still another embodiment of the present invention.

The nitrogen-containing gas is supplied into the process chamber 201 from the gas supply pipe 232d via the MFC 241d, the valve 243d, and the nozzle 249d, Also, for example, as illustrated in FIG. 6, in the process B, a SiOC film or a SiOCN film may be formed as a SiC-based film by performing a process of supplying, for example, $O_2$ gas as an oxidizing gas, i.e., an oxygen-containing gas.

The oxygen-containing gas is supplied into the process chamber 201 from the gas supply pipe 232c via the MFC 241c, the valve 243c, and the nozzle 249c.

Figure 7:
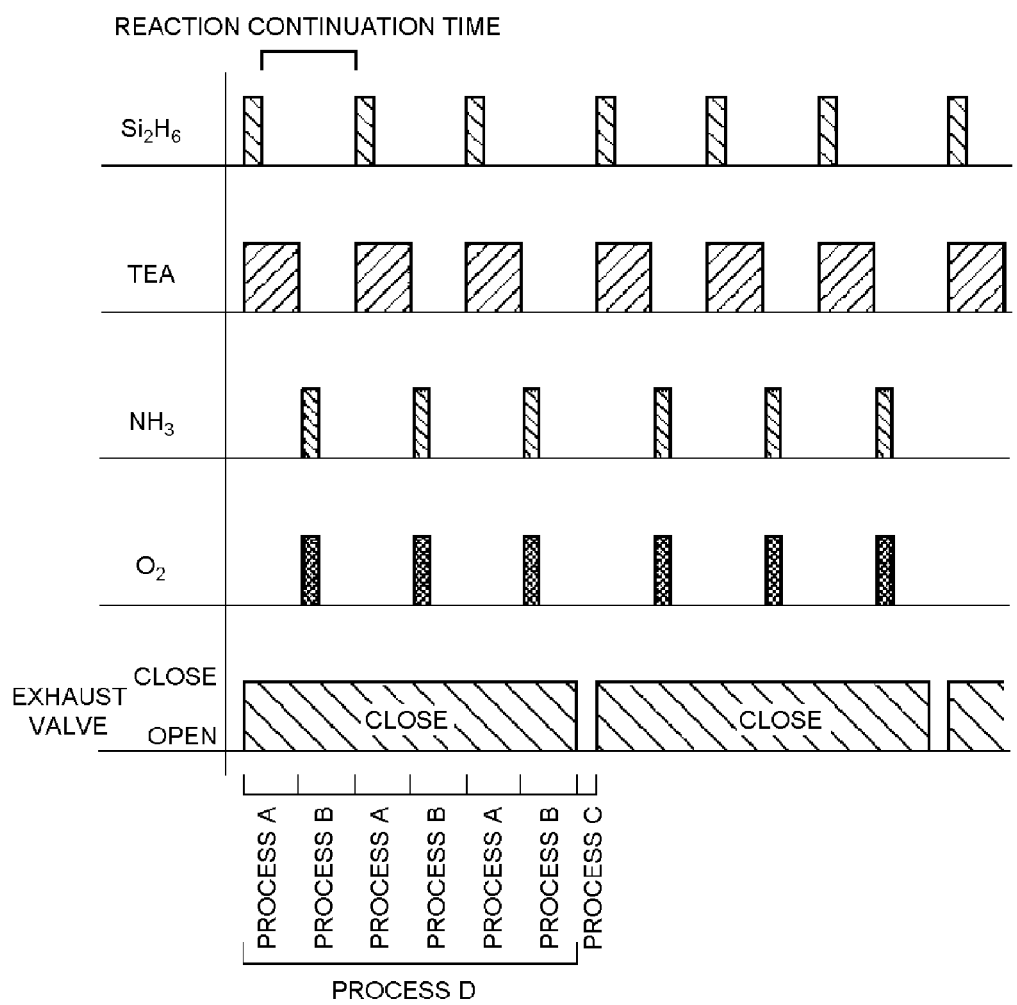
FIG. 7 is a diagram illustrating a sequence of a film-forming process according to yet another embodiment of the present invention.

Also, for example, as illustrated in FIG. 7, in the process B, a SiOCN film may be supplied as a SiC-based film by performing a process of supplying $NH_3$ gas as a nitrogen-containing gas and a process of supplying $O_2$ gas as an oxygen-containing gas.

Referring to FIG. 7, although the process of supplying the $NH_3$ gas and the process of supplying the $O_2$ gas are simultaneously performed, the process of supplying the $NH_3$ gas may be performed prior to the process of supplying the $O_2$ gas or the process of supplying the $O_2$ gas may be performed prior to the process of supplying the $NH_3$ gas.

Referring to FIGS. 5 through 7, a case in which a process of supplying a nitrogen-containing gas and/or a process of supplying an oxygen-containing gas are performed while suspending the supply of the $Si_2H_6$ gas and the TEA gas, e.g., in the process B, has been described above. However, the present invention is not limited to the above embodiment, and at least one film among a SiCN film, a SiOC film, and a SiOCN film may be formed as a SiC-based film by performing a process of supplying a nitrogen-containing gas and/or a process of supplying an oxygen-containing gas, for example, while maintaining the supply of the $Si_2H_6$ gas and the TEA gas, e.g., in the process A.

Here, the silicon-based gas means a gas containing silicon (silicon-containing gas). For example, a silane-based gas such as disilane ($Si_2H_6$) gas or trisilane ($Si_3H_8$) gas may be preferably used as the silicon-based gas. In the present embodiment, a silane-based gas that contains silicon (Si) and hydrogen (H) but does not contain chlorine (Cl) is used as the silicon-based gas.

The amine-based gas means a gas containing an amine group, and contains at least carbon (C), nitrogen (N), and hydrogen (H). Examples of the amine-based gas include amines, e.g., ethylamine, propylamine, isopropyl amine, butylamine, isobutyl amine, etc. Here, "amine" is a generic term for a compound obtained by replacing a hydrogen atom of ammonia ($NH_3$) with a hydrocarbon radical such as an alkyl group. That is, an amine contains a hydrocarbon radical such as an alkyl group. The amine-based gas may be referred to as a silicon-free gas since it does not contain silicon (Si), and may be referred to as a silicon- and metal-free gas since it does not contain a metal. For example, an ethylamine-based gas such as triethylamine $[(C_2H_5)_3N$, abbreviated to: TEA], diethylamine $[(C_2H_5)_2NH$, abbreviated to: DEA], or monoethylamine ($C_2H_5NH_2$, abbreviated to: MEA); a propylamine-based gas such as tripropylamine $[(C_3H_7)_3N$, abbreviated to: TPA], dipropylamine $[(C_3H_7)_2NH$, abbreviated to: DPA], or monopropylamine ($C_3H_7NH_2$, abbreviated to: MPA); an isopropyl amine-based gas such as triisopropyl amine ($[(CH_3)_2CH]_3N$, abbreviated to: TIPA), diisopropyl amine ($[(CH_3)_2CH]_2NH$, abbreviated to: DIPA), or monoisopropyl amine $[(CH_3)_2CHNH_2$, abbreviated to: MIPA]; a butylamine-based gas such as tributyl amine $[(C_4H_9)_3N$, abbreviated to: TBA], dibutylamine $[(C_4H_9)_2NH$, abbreviated to: DBA], or monobutylamine ($C_4H_9NH_2$, abbreviated to: MBA); or an isobutylamine-based gas such as triisobutylamine ($[(CH_3)_2CHCH_2]_3N$, abbreviated to: TIBA), diisobutylamine ($[(CH_3)_2CHCH_2]_2NH$, abbreviated to: DIBA), or monoisobutyl amine $[(CH_3)_2CHCH_2NH_2$, abbreviated to: MIBA] may be preferably used as the amine-based gas. That is, for example, at least one among $((C_2H_5)_xNH_{3-x})$, $((C_3H_7)_xNH_{3-x})$, $([(CH_3)_2CH]_xNH_{3-x})$, $((C_4H_9)_xNH_{3-x})$, and $([(CH_3)_2CHCH_2]_xNH_{3-x})$ may be preferably used as the amine-based gas. Here, 'x' denotes an integer that is equal to or greater than 1 and less than or equal to 3.

For example, ammonia ($NH_3$) gas, diazene ($N_2H_2$) gas, hydrazine ($N_2H_4$) gas, $N_3H_8$ gas, etc. may be preferably used as a nitriding gas, i.e., a nitrogen-containing gas. The nitrogen ($N_2$) gas is an inert gas, is not included in the SiC film, and is thus excluded from the nitrogen-containing gas.

For example, oxygen ($O_2$) gas, nitrous oxide ($N_2O$) gas, nitric oxide (NO) gas, nitrogen dioxide ($NO_2$) gas, ozone ($O_3$) gas, hydrogen ($H_2$) gas+$O_2$ gas, $H_2$ gas+$O_3$ gas, vapor ($H_2O$) gas, carbon monoxide (CO) gas, carbon dioxide ($CO_2$) gas, etc. may be preferably used as an oxidizing gas, i.e., an oxygen-containing gas.

Although various embodiments of the present invention have been described above, the present invention is not limited thereto.

For example, in the above embodiments, it has been described that the communication section 270 is formed above a region of the inner tube 203b that horizontally encompasses the wafer region, and particularly, on the upper end portion 203c of the inner tube 203b. However, the present invention is not limited to the above embodiments. That is, as described above, the communication section 270 may be formed above the wafer region at the sidewall portion of the inner tube 203b and near the upper end portion 203c. Also, as illustrated in FIG. 13, the communication section 270 may be formed below a region of the sidewall portion of the inner tube 203b that horizontally encompasses the wafer region and in a region that horizontally encompasses the insulating plate arrangement region.

When the communication section 270 is formed in the region of the inner tube 203b that horizontally encompasses the wafer region, the length of a path in which active species generated between the outer tube 203a and the inner tube 203b arrives at the wafer 200 is short and the active species easily contact the wafers 200. As a result, the uniformity of the thickness and quality of a thin film formed on the wafers 200 is likely to be degraded within and between planes of the wafers 200. That is, an average thickness of a thin film formed on the wafer 200 adjacent to the communication section 270 within the planes of the wafer 200 is likely to be greater than that of a thin film formed on a wafer 200 distant from the communication section 270 within the planes of the wafer 200. Also, the uniformity of the thickness of the thin film formed on the wafer 200 adjacent to the communication section 270 within the planes of the wafer 200 is likely to be lower than that of the thin film formed on the wafer 200 distant from the communication section 270 within the planes of the wafer 200.

Figure 13:
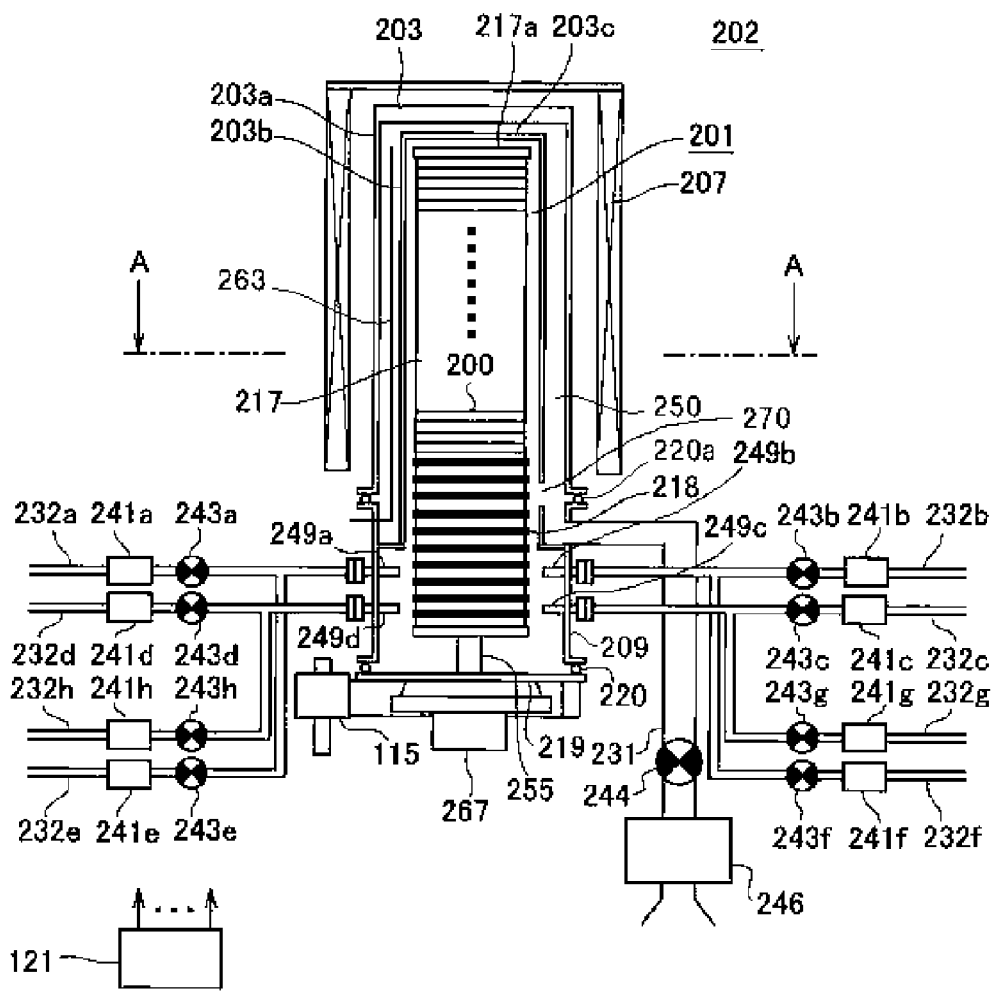
FIG. 13 is a diagram illustrating a structure of an inner tube according to other embodiments of the present invention.

In this regard, as illustrated in FIG. 1 or 13, when the communication section 270 is formed above or below the region of the inner tube 203b horizontally encompassing the wafer region, the length of a path in which active species generated between the outer tube 203a and the inner tube 203b arrive at the wafer 200 may be increased and the active species may be suppressed from contacting the wafer 200. As a result, the uniformity of the thickness and quality of the thin films formed on the wafers 200 within and between planes of the wafers 200 may be improved.

Figure 14:
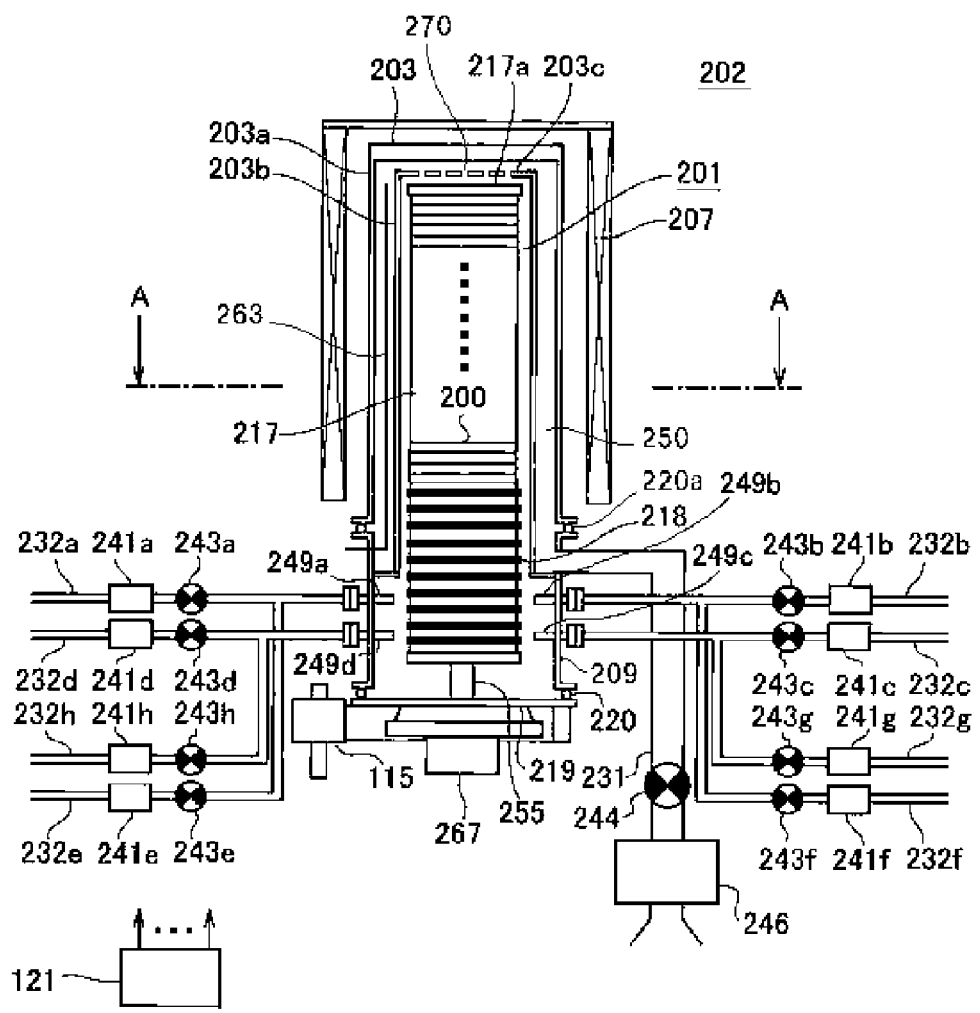
FIG. 14 is a diagram illustrating a structure of an inner tube according to other embodiments of the present invention.

Also, in the above embodiments, it has been described above that one communication section 270 is formed on the central portion of the upper end portion 203c of the inner tube 203b. However, the present invention is not limited to the above embodiments, and for example, a plurality of communication sections 270 may be formed on the upper end portion 203c of the inner tube 203b. That is, as illustrated in FIG. 14, a plurality of communication sections 270 may be formed on the central portion of the upper end portion 203c of the inner tube 203b and portions of the upper end portion 203c of the inner tube 203b thereof (circumferential portions, etc.) other than the central portion. Otherwise, a plurality of communication sections 270 may be formed only on circumferential portions of the upper end portion 203c of the inner tube 203b rather than the central portion of the upper end portion 203c of the inner tube 203b.

As described above, when the communication section 270 is formed on the central portion of the upper end portion 203c of the inner tube 203b, the length of a path in which active species passing through the communication section 270 arrive at the wafer 200 may be increased. As a result, the active species passing through the communication section 270 are likely to be consumed before the active species arrives at the wafer 200. Thus, the active species may be suppressed from contacting the wafer 200.

In this regard, when the communication section 270 is formed on the circumferential portions or the like of the upper end portion 203c of the inner tube 203b, the active species passing through the communication section 270 may be suppressed from contacting the wafer 200 by reducing the size (diameter, opening, area, etc.) of the communication section 270. Specifically, the active species may be suppressed from contacting the wafer 200 by adjusting the sizes of the communication sections 270 formed on the circumferential portions, etc. to set the amount of the active species passing through the communication section 270 such that most of the active species are consumed before the active species arrive at the wafer 200. In this case, the sizes of the communication sections 270 may be set to gradually reduce as the distance between the central portion of the upper end portion 203c of the inner tube 203b and each of the communication sections 270 increases.

However, even if the communication sections 270 are formed on the circumferential portions, etc. of the upper end portion 203c of the inner tube 203b, the communication sections 270 are preferably formed to face the top surface (ceiling plate) 217a of the boat 217 and to be closed by the top surface 217a of the boat 217. That is, when the communication sections 270 are formed on the circumferential portions, etc. of the upper end portion 203c of the inner tube 203b, the communication sections 270 are preferably formed to face a portion more adjacent to the center of the top surface 217a of the boat 217 than an end portion (edge) of the top surface 217a of the boat 217. Thus, the length of a path in which the active species passing through the communication section 270 arrive at the wafer 200 may be increased.

Also, in the above embodiments, cases in which both a silicon-based gas and an amine-based gas are thermally decomposed in the process A or B have been described. However, the present invention is not limited to the above embodiments, and for example, at least one of a silicon-based gas and an amine-based gas may be thermally decomposed. For example, only the silicon-based gas or the amine-based gas may be thermally decomposed. However, both the silicon-based gas and the amine-based gas are more preferably thermally decomposed when the efficiency of a reaction is considered.

Also, in the above embodiments, cases in which the supply of the silicon-based gas and the amine-based gas is suspended in the process B have been described above. However, the present invention is not limited to the above embodiments, and for example, an inert gas such as $N_2$ gas may be continuously supplied into the nozzles 249a through 249d in the process B. In this case, the inert gas is supplied into the process chamber 201 and the pressure in the process chamber 201 increases. Also, the pressure in the process chamber 201 is controlled not to exceed a process pressure, i.e., a desired pressure that falls within a range of 100 to 2,000 Pa, by controlling the flow rate of the inert gas supplied into the nozzles 249a through 249d. In the process B, a film containing silicon (Si) or carbon (C) may be prevented from being formed in the nozzles 249a through 249d by continuously supplying the inert gas into the nozzles 249a through 249d.

Also, in the above embodiments, cases in which a ladder boat (in which locking grooves are formed in boat pillars) is used as a support for supporting a substrate have been described. However, the present invention is not limited to the above embodiments and may be preferably applied to a case in which a ring boat is used. In this case, the ring boat may be configured by, for example, three or four boat pillars that stand at appropriate intervals in a circumferential direction, and ring-shaped holders that are support plates installed in a multistage manner and horizontally with respect to the boat pillars to support an outer circumference of a substrate at a back side thereof. In this case, the ring-shaped holder may include a ring-shaped plate, the external diameter of which is greater than the diameter of the substrate and the internal diameter of which is less than the diameter of the substrate, and a plurality of substrate supporting claws that are installed at appropriate intervals and in the circumferential direction of the ring-shaped plate and configured to support the back surface of the outer circumference of the substrate. Otherwise, the ring-shaped holder may include a ring-shaped plate, the external and internal diameters of which are greater than the diameter of the substrate, and substrate supporting claws that are installed in the circumferential direction of an inner side of the ring-shaped plate and at appropriate intervals and are configured to support the back side of the circumference of the substrate. When the ring-shaped plate is used, the distances between holes of each of nozzles and regions partitioned between substrates (regions partitioned by the ring-shaped plate in this case) are short and gases emitted from the respective nozzles are can thus easily be widely spread over the substrate arrangement region, compared to when the ring-shaped plate is not present. Thus, a sufficient supply rate of a gas supplied onto the substrate may be maintained, and a film forming speed or uniformity may be prevented from being degraded. When the ring boat is used, a SiC-based film having a high flatness and a uniform thickness may be formed.

Also, in the above embodiments, cases in which a SiC-based film is formed using a silicon-based gas and an amine-based gas have been described above. However, the present invention is not limited to the above embodiments, and for example, an organic silicon-based gas (hereinafter referred to also as an organic silicon source) may be used instead of the silicon-based gas and the amine-based gas. For example, at least one source among $Si_2C_2H_{10}$, $SiC_2H_8$, $Si_2CH_8$, $SiC_3H_{10}$, $Si_3CH_{10}$, $SiC_4H_{12}$, $Si_2C_3H_{12}$, $Si_3C_2H_{12}$, $Si_4CH_{12}$, $SiC_2H_6$, $SiC_3H_8$, $Si_2C_2H_8$, $SiC_4H_{10}$, $Si_2C_3H_{10}$, $Si_3C_2H_{10}$, etc., which are organic silane sources, may be preferably used as the organic silicon source. That is, a source expressed as $(Si_xC_yH_{2(x+y+1)})$ may be preferably used as the organic silicon source when, for example, carbon atoms are in a single bond, and a source expressed as $(Si_xC_{(y+1)}H_{2(x+y+1)})$ may be preferably used when, for example, carbon atoms are in a double bond. In the above formulae, 'x' and 'y' each denote an integer that is equal to or greater than 1. Each of these organic silane sources consists of only three components, i.e., silicon (Si), carbon (C), and hydrogen (H) and does not contain chlorine (Cl), and may thus be referred to as a chlorine-free silane-based source. The organic silicon source may not only act as a silicon source when a SiC film is formed but also act as a carbon source. In this case, a hydrogen-containing gas may be supplied together with the organic silicon-based gas. For example, hydrogen ($H_2$) gas, ammonia ($NH_3$) gas, a hydrocarbon-based gas (e.g., methane ($CH_4$) gas, diazene ($N_2H_2$) gas, hydrazine ($N_2H_4$) gas, $N_3H_8$ gas, etc.), a silane-based gas (e.g., $SiH_4$, $Si_2H_6$, etc.) may be preferably used as the hydrogen-containing gas.

Also, in the above embodiments, cases in which a silicon-based insulating film containing silicon (Si) which is a semiconductor element, e.g., a SiC film, a SiCN film, a SiOCN film, or a SiOC film, is formed have been described above. However, the present invention is not limited to the above embodiments, and may be applied to a case in which a metal-based thin film that contains a metal element, e.g., titanium (Ti), zirconium (Zr), hafnium (Hf), tantalum (Ta), aluminum (Al), or molybdenum (Mo), is formed.

For example, the present invention may be preferably applied to a case in which a metal carbide film such as a titanium carbide film (TiC film), a zirconium carbide film (ZrC film), a hafnium carbide film (HfC film), a tantalum carbide film (TaC film), an aluminum carbide film (AlC film), a molybdenum carbide film (MoC film) is formed.

Also, the present invention may be preferably applied to a case in which a metal carbonitride film, such as a titanium carbonitride film (TiCN film), a zirconium carbonitride film (ZrCN film), a hafnium carbonitride film (HfCN film), a tantalum carbonitride film (TaCN film), an aluminum carbonitride film (AlCN film), or a molybdenum carbonitride film (MoCN film), is formed.

Also, the present invention may be preferably applied to a case in which a metal oxycarbonitride film, such as a titanium oxycarbonitride film (TiOCN film), a zirconium oxycarbonitride film (ZrOCN film), a hafnium oxycarbonitride film (HfOCN film), a tantalum oxycarbonitride film (TaOCN film), an aluminum oxycarbonitride film (AlOCN film), or a molybdenum oxycarbonitride film (MoOCN film), is formed.

Also, the present invention may be preferably applied to a case in which a metal oxycarbide film, such as a titanium oxycarbide film (TiOC film), a zirconium oxycarbide film (ZrOC film), a hafnium oxycarbide film (HfOC film), a tantalum oxycarbide film (TaOC film), an aluminum oxycarbide film (AlOC film), or a molybdenum oxycarbide film (MoOC film), is formed.

In this case, a film may be formed according to a sequence similar to in the above embodiments using a metal-based source gas that contains metal elements instead of the silicon-based gas used in the above embodiments.

For example, a titanium (Ti) based source gas, such as titanium tetrachloride ($TiCl_4$) or titanium tetrafluoride ($TiF_4$), may be used as a source gas when a metal-based thin film containing titanium (Ti) (e.g., a TiC film, a TiCN film, a TiOCN film, or a TiOC film) is formed. Here, the types of an amine-based gas, a nitrogen-containing gas, and an oxygen-containing gas may be the same as in the above embodiments. In this case, process conditions may be the same as, for example, in the above embodiments.

Also, for example, a zirconium (Zr) based source gas, such as zirconium tetrachloride ($ZrCl_4$) or zirconium tetrafluoride ($ZrF_4$), may be used as a source gas when a metal-based thin film containing zirconium (Zr) (e.g., a ZrC film, a ZrCN film, a ZrOCN film, or a ZrOC film) is formed. Here, the types of an amine-based gas, a nitrogen-containing gas, and an oxygen-containing gas may be the same as in the above embodiments. In this case, process conditions may be the same as, for example, in the above embodiments.

Also, for example, a hafnium (Hf) based source gas, such as hafnium tetrachloride ($HfCl_4$) or hafnium tetrafluoride ($HfF_4$), may be used as a source gas when a metal-based thin film containing hafnium (Hf) (e.g., a HfC film, a HfCN film, a HfOCN film, or a HfOC film) is formed. Here, the types of an amine-based gas, a nitrogen-containing gas, and an oxygen-containing gas may be the same as in the above embodiments. In this case, process conditions may be the same as, for example, in the above embodiments.

Also, for example, a tantalum (Ta) based source gas, such as tantalum pentachloride ($TaCl_5$) or tantalum pentafluoride ($TaF_5$), may be used as a source gas when a metal-based thin film containing tantalum (Ta) (e.g., a TaC film, a TaCN film, a TaOCN film, or a TaOC film) is formed. Here, the types of an amine-based gas, a nitrogen-containing gas, and an oxygen-containing gas may be the same as in the above embodiments. In this case, process conditions may be the same as, for example, in the above embodiments.

Also, for example, an aluminum (Al) based source gas, such as aluminum trichloride ($AlCl_3$) or aluminum trifluoride ($AlF_3$), may be used as a source gas when a metal-based thin film containing aluminum (Al) (e.g., an AlC film, an AlCN film, an AlOCN film, or an AlOC film) is formed. Here, the types of an amine-based gas, a nitrogen-containing gas, and an oxygen-containing gas may be the same as in the above embodiments. In this case, process conditions may be the same as, for example, in the above embodiments.

Also, for example, a molybdenum (Mo) based source gas, such as molybdenum pentachloride ($MoCl_5$) or molybdenum pentafluoride ($MoF_5$), may be used as a source gas when a metal-based thin film containing molybdenum (Mo) (e.g., a MoC film, a MoCN film, a MoOCN film, or a MoOC film) is formed. Here, the types of an amine-based gas, a nitrogen-containing gas, and an oxygen-containing gas may be the same as in the above embodiments. In this case, process conditions may be the same as, for example, in the above embodiments.

That is, the present invention may be preferably applied to a case in which a thin film containing a predetermined element such as a semiconductor element or a metal element is formed.

The present invention may be also applied to a case in which a film other than a film containing a predetermined element and carbon (C), a film containing a predetermined element, carbon (C), and nitrogen (N), a film containing a predetermined element, oxygen (O), carbon (C), and nitrogen (N), and a film containing a predetermined element, oxygen (O), and carbon (C) is formed. For example, the present invention may be applied to a case in which a film, such as a SiN film, a SiO film, a SiON film, a TiN film, a TiO film, a TiON film, a ZrN film, a ZrO film, a ZrON film, a HfN film, a HfO film, a HfON film, a TaN film, a TaO film, a TaON film, an AlN film, an AlO film, an AlON film, a MoN film, a MoO film, a MoON film, a WN film, a WO film, or a WON film, is formed.

In this case, combinations of various gases described above may be used when a film containing silicon (Si), i.e., a silicon (Si) based film, is formed. Also, combinations of various gases described above may be used when a film containing a metal, i.e., a metal-based film, is formed. When a silicon (Si) based film is formed, not only combinations of the various gases described above but also those of an organic source, e.g., tris(dimethylamino)silane ($Si[N(CH_3)_2]_3H$, abbreviated to: 3DMAS), tetrakis(dimethylamino)silane ($Si[N(CH_3)_2]_4$, abbreviated to: 4DMAS), bis(diethylamino)silane ($Si[N(C_2H_5)_2]_2H_2$, abbreviated to: 2DEAS), bis(tertiarybutylamino)silane ($SiH_2[NH(C_4H_9)]_2$, abbreviated to: BTBAS), hexamethyl disilazane [$(CH_3)_3Si\text{—}NH\text{—}Si(CH_3)_3$, abbreviated to: HMDS], or tetraethoxysilane [$Si(OC_2H_5)_4$, abbreviated to: TEOS], may be used.

Also, in the above embodiments, the process tube 203 including the outer tube 203a, the inner surface of the upper end portion of which has a flat shape, and the inner tube 203b, the upper end portion 203c (top surface) of which covers at least a portion of the top surface 217a of the boat 217 supporting the wafers 200 and in which the communication section 270 that communicates between the inside of the inner tube 203b and the inside of the outer tube 203a is formed on the central portion of the upper end portion 203c (top surface) thereof has been described above. However, the present invention is not limited to the above embodiments.

Figure 8A:
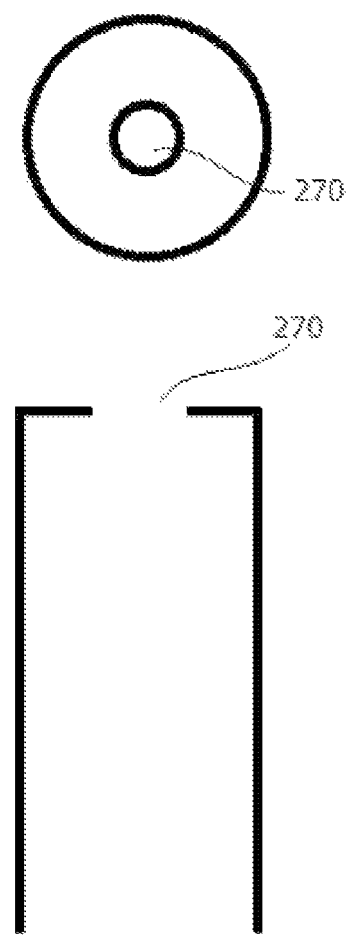
FIGS. 8A through 8L are diagrams illustrating structures of an inner tube according to various embodiments of the present invention.
Figure 8B:
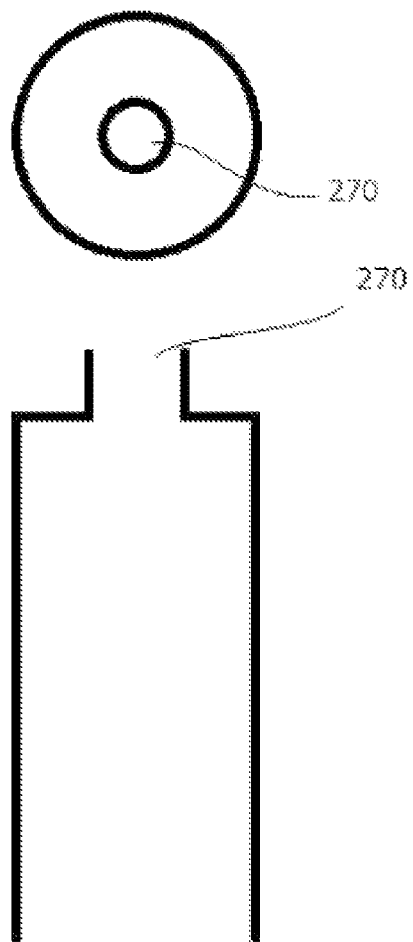
Figure 8C:
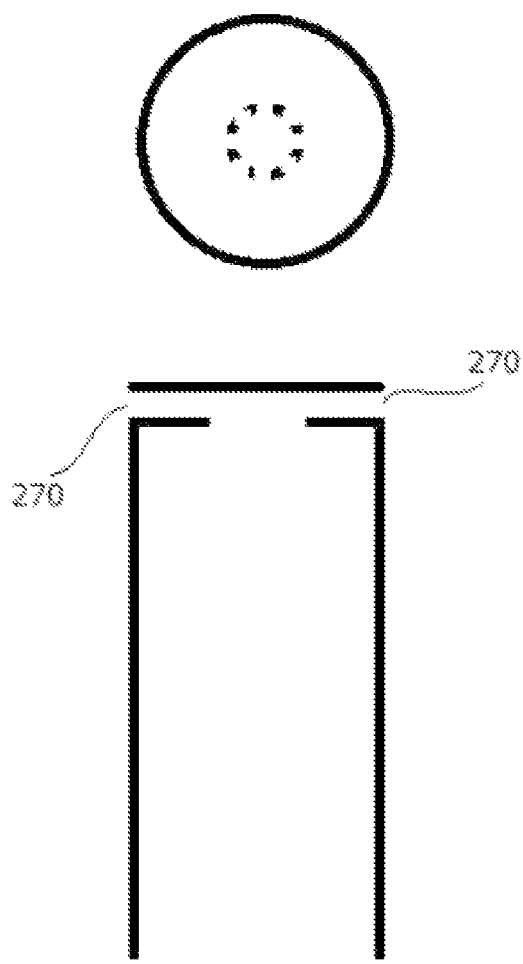
Figure 8D:
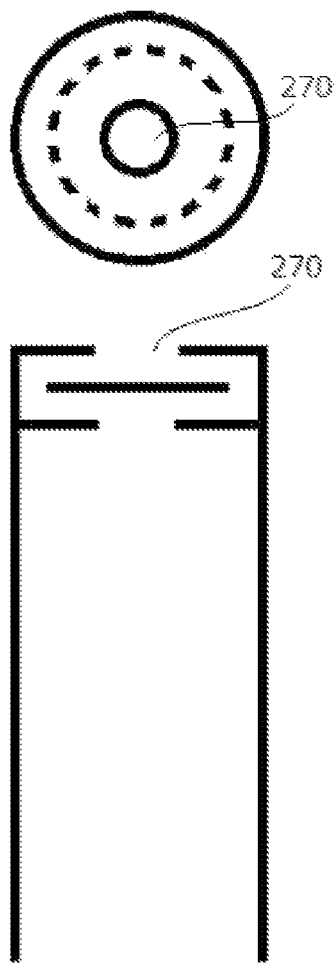
Figure 8E:
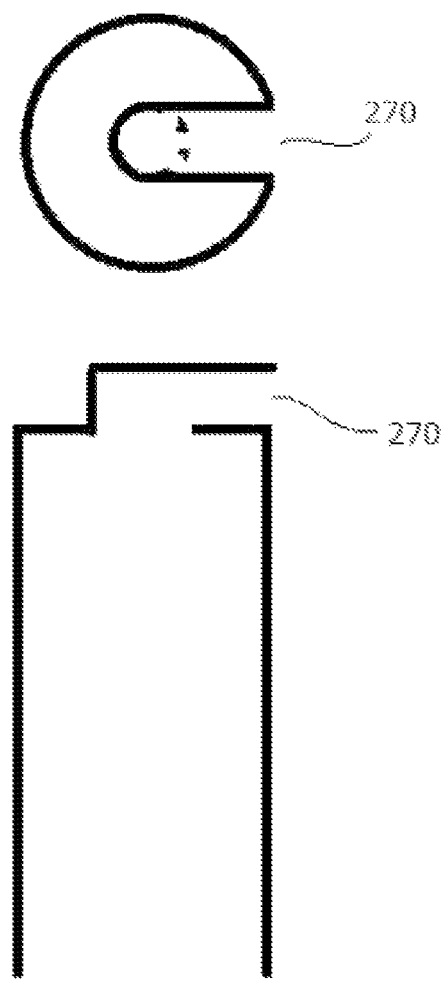
Figure 8F:
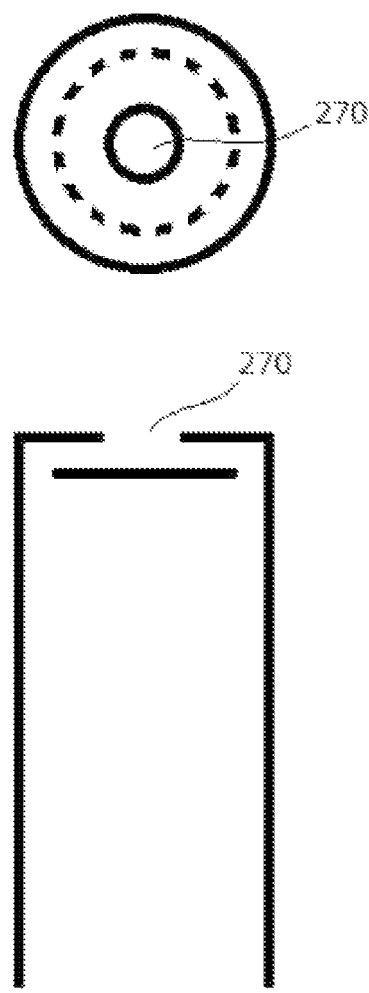
Figure 8G:
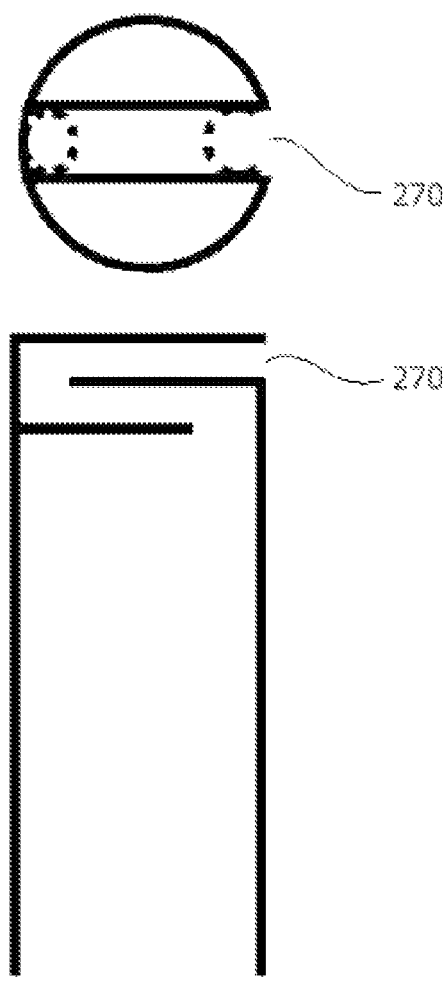
Figure 8H:
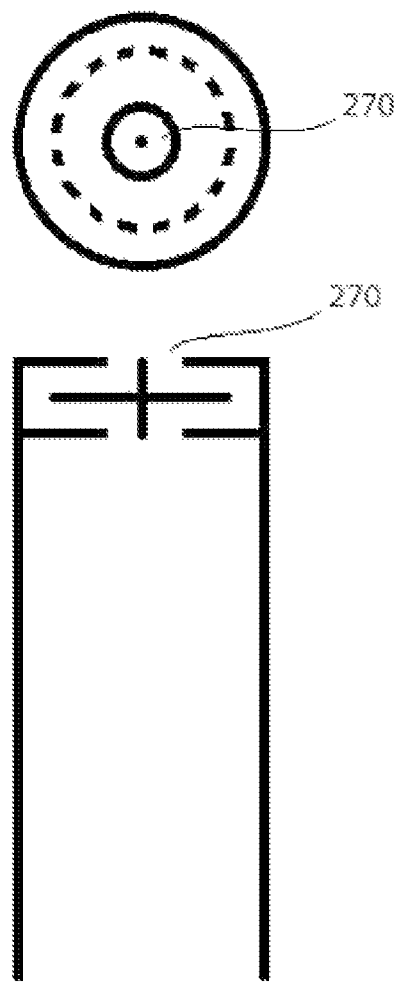
Figure 8I:
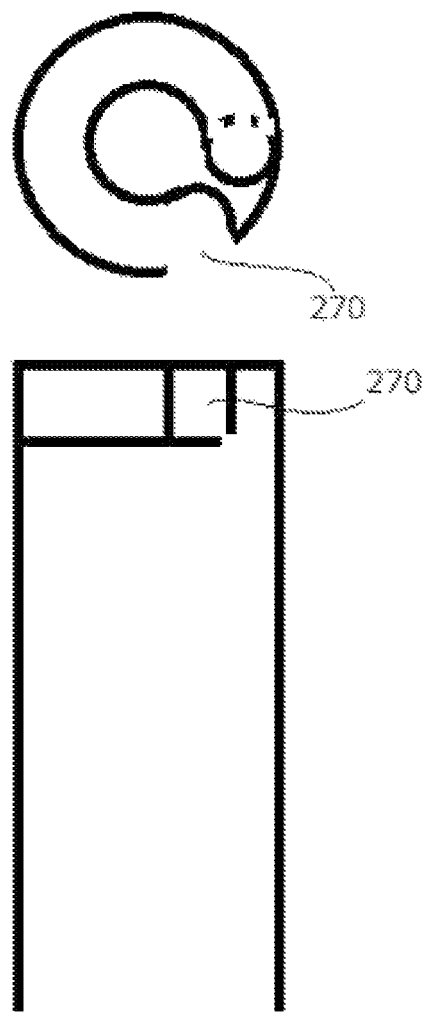
Figure 8J:
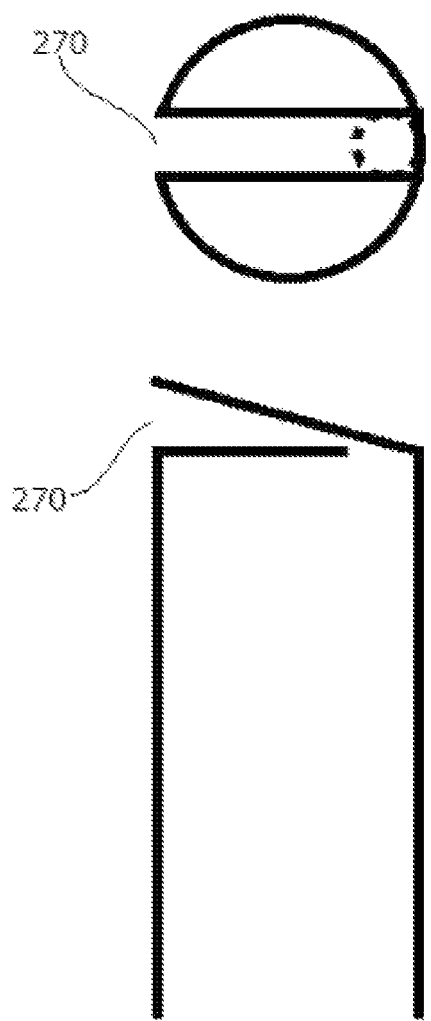
Figure 8K:
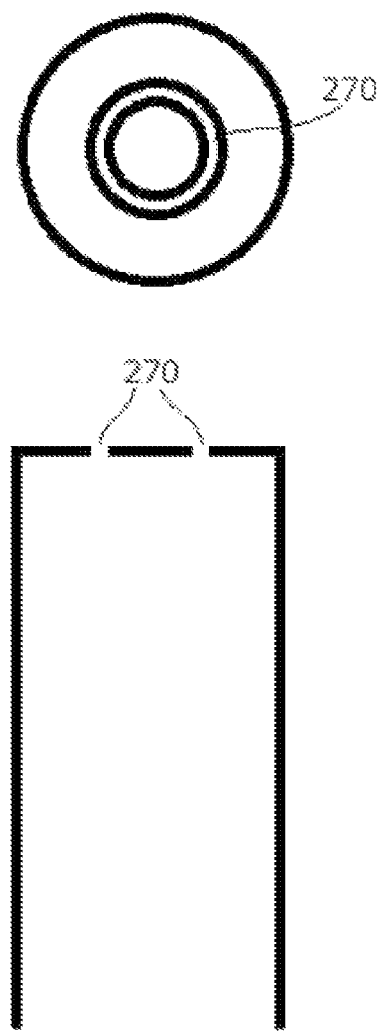
Figure 8L:
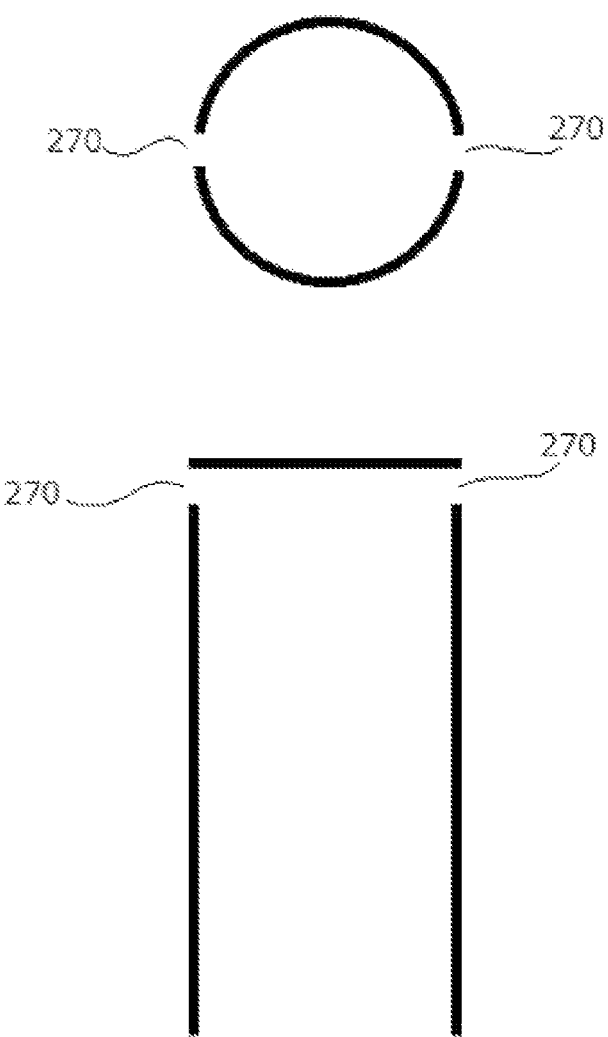
Figure 9A:
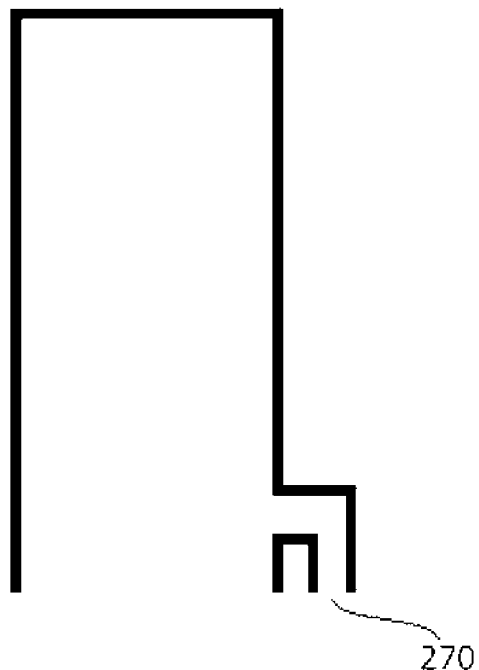
FIGS. 9A through 9H are diagrams illustrating structures of an inner tube according to other various embodiments of the present invention.
Figure 9B:
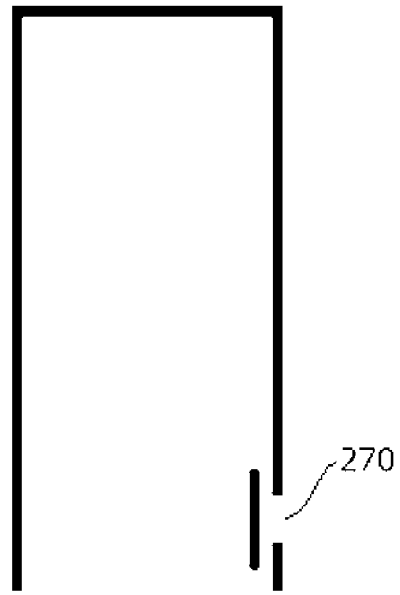
Figure 9C:
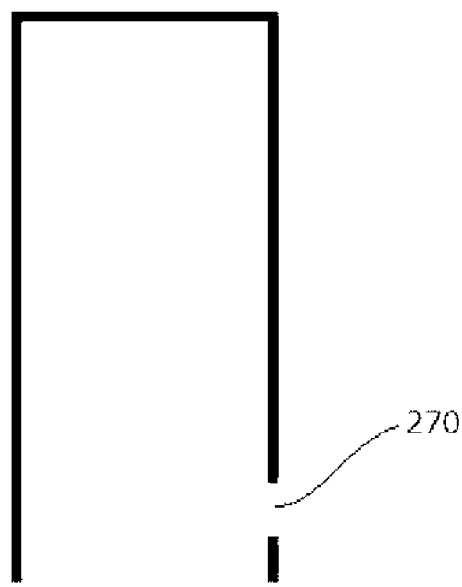
Figure 9D:
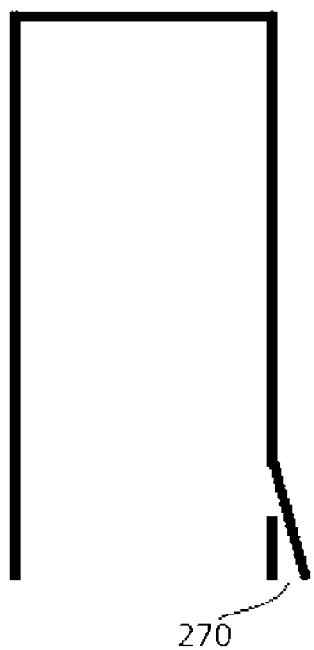
Figure 9E:
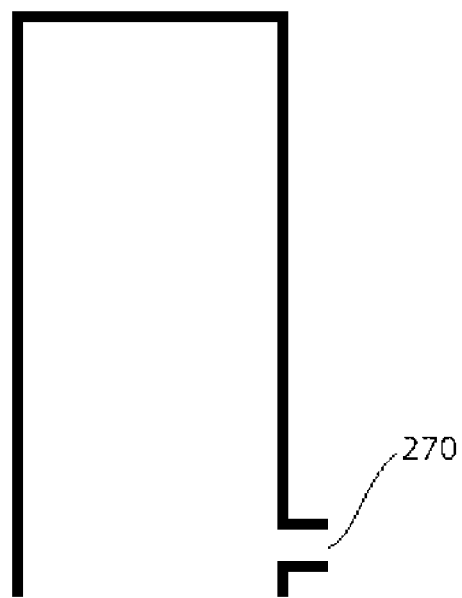
Figure 9F:
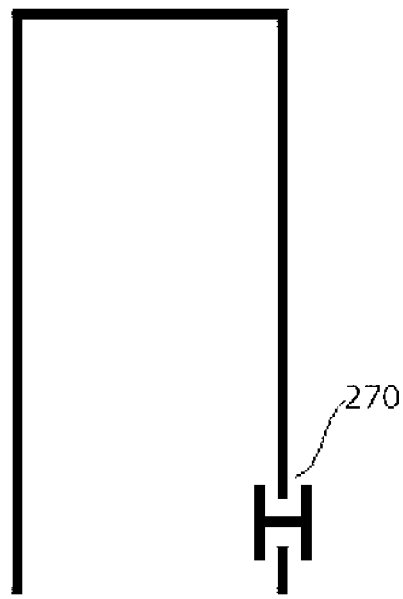
Figure 9G:
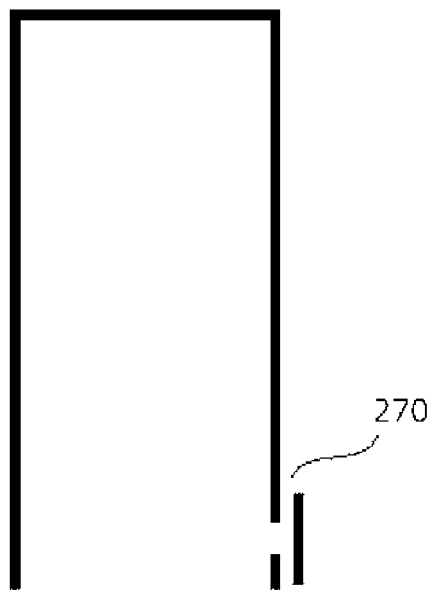
Figure 9H:
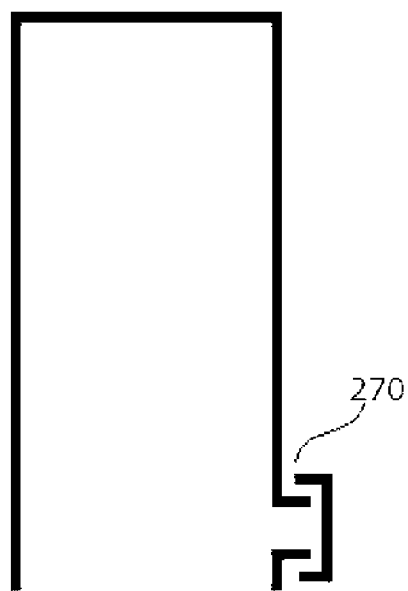
Figure 10A:
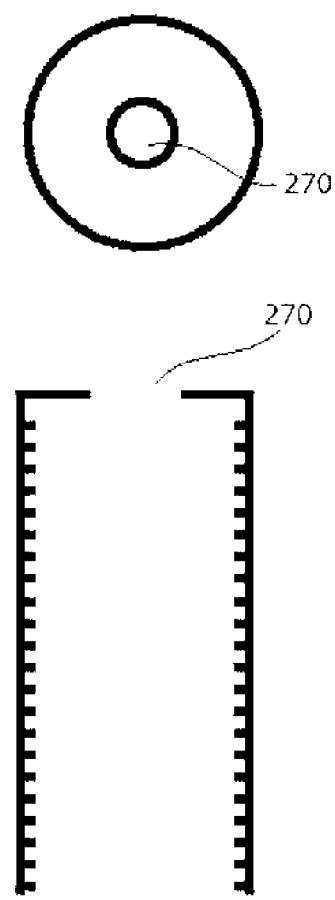
FIGS. 10A and 10B are diagrams illustrating structures of an inner tube according to other various embodiments of the present invention.
Figure 10B:
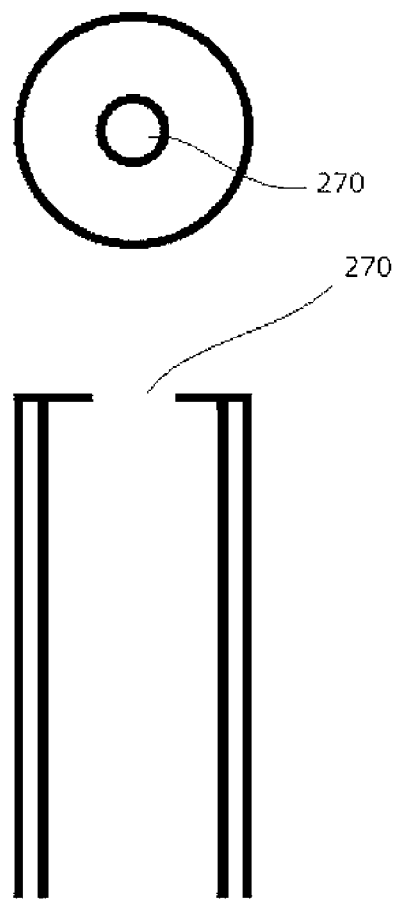
Figure 11A:
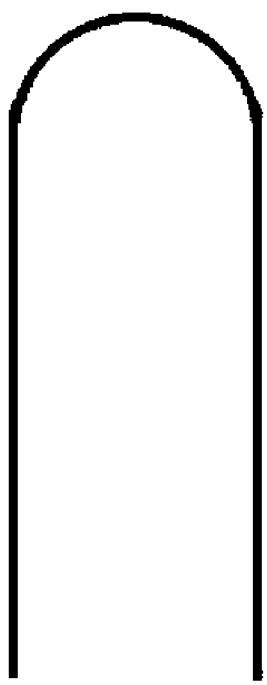
FIGS. 11A through 11J are diagrams illustrating structures of an outer tube according to various embodiments of the present invention.
Figure 11B:
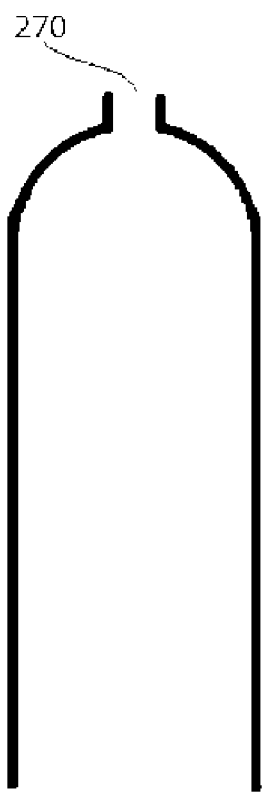
Figure 11C:
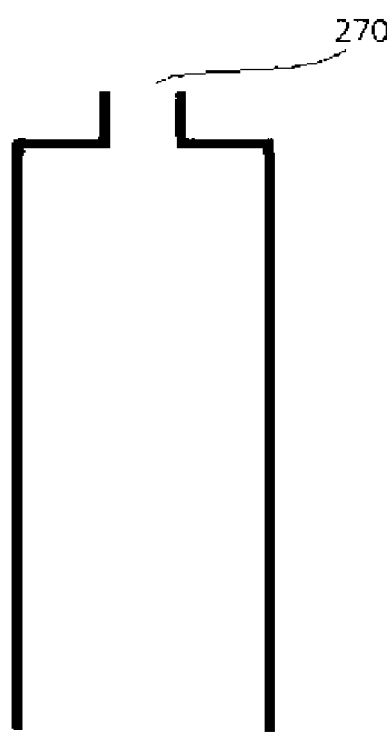
Figure 11D:
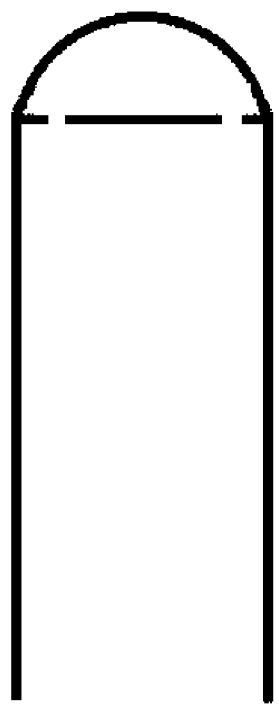
Figure 11E:
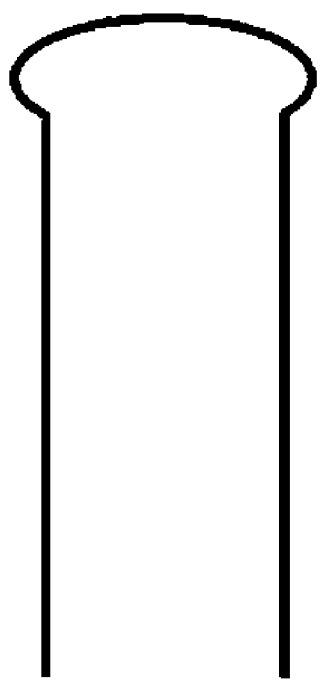
Figure 11F:
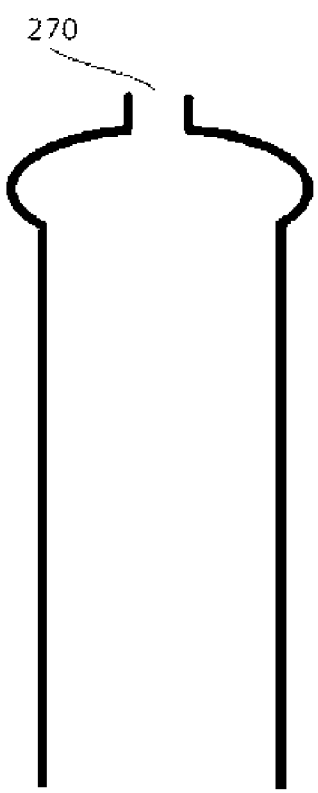
Figure 11G:
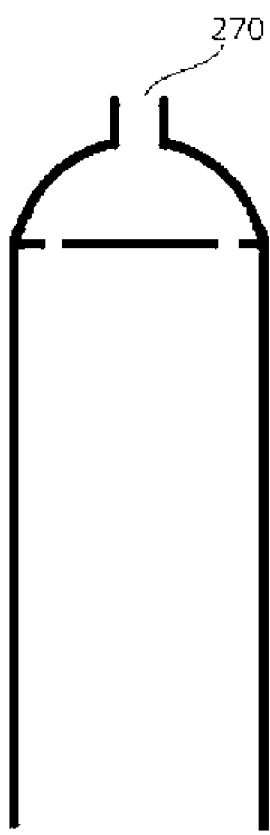
Figure 11H:
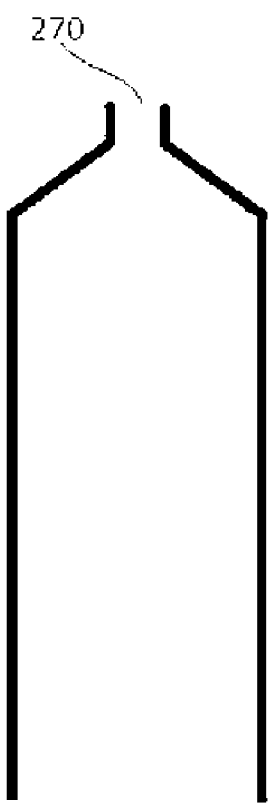
Figure 11I:
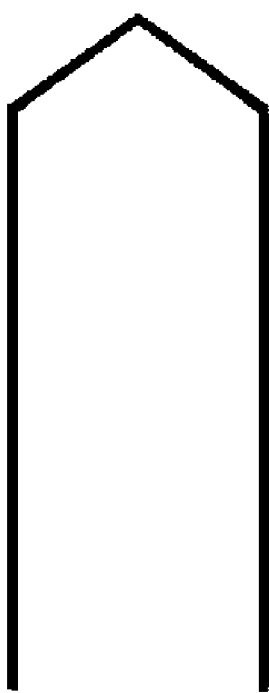
Figure 11J:
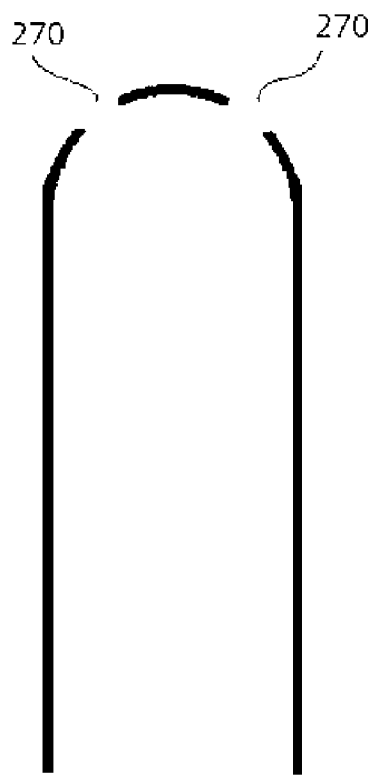

For example, the inner tube 203b may have the structure according to one of the above embodiments as illustrated in FIG. 8A or may have a structure as illustrated in one of FIGS. 8B through 8L. As illustrated in FIGS. 8A through 8L, the communication section 270 may have not only a ring shape (circular shape) but also a triangular shape, a quadrilateral shape, a polygonal shape, or a combination thereof. Also, the number of the communication sections 270 may be more than one as described above. For example, two, three, or more (many) communication sections 270 may be formed. When a plurality of communication sections 270 are formed, the arrangement of the plurality of communication sections 270 is not limited. Also, the communication section 270 may have a slit shape. In the case of a type of a substrate processing apparatus in which a process gas contained in the inner tube 203b is exhausted via a lower portion thereof, the inner tube 203b may have a structure as illustrated in one of FIGS. 9A through 9H. Otherwise, the inner tube 203b may have a structure that is a combination of an upper structure of the inner tube 203b illustrated in one of FIGS. 8A through 8L and a lower structure of the inner tube 203b illustrated in one of FIGS. 9A through 9H. Also, the shape of the inner tube 203b may be the same as or roughly similar to a pure cylindrical shape. Also, the inner tube 203b may have an inner wall surface structure as illustrated in FIG. 10A or 10B. Also, the inner tube 203b may have a structure obtained from an appropriate combination of the structures illustrated in FIGS. 8A through 8L, 9A through 9H, 10A, and 10B.

Figure 12A:
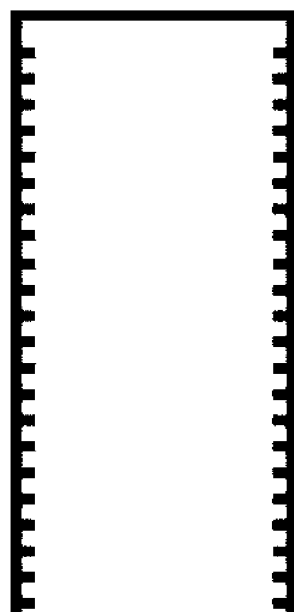
FIGS. 12A and 12B are diagrams illustrating structures of an outer tube according to other various embodiments of the present invention.
Figure 12B:
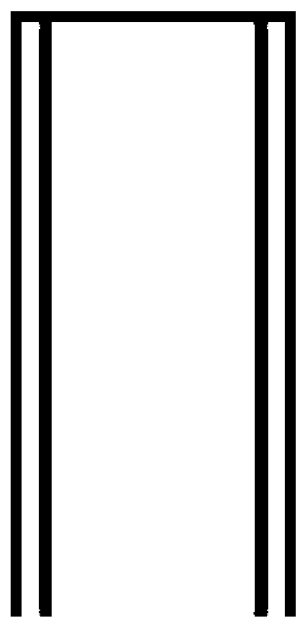

The outer tube 203a may have a structure as illustrated in one of FIGS. 11A through 11J. Also, the shape of the outer tube 203a may be the same as or roughly similar to a pure cylindrical shape. Also, the outer tube 203a may have an inner wall surface structure as illustrated in FIG. 12A or 12B. Also, the outer tube 203a may have a structure obtained from an appropriate combination of the structures illustrated in FIGS. 11A through 11J, 12A, and 12B.

Also, in the above embodiments, a case in which a film is formed using a batch type substrate processing apparatus capable of processing a plurality of substrates at once has been described. However, the present invention is not limited to the above embodiments and may be preferably applied to a case in which a film is formed using, for example, a single-wafer substrate processing apparatus capable of processing one or several substrates at once.

Also, an appropriate combination of the methods of forming a film according to the above embodiments or application examples thereof may be used.

A plurality of process recipes (programs each storing a process sequence or conditions) may be preferably individually prepared according to the details of substrate processing (e.g., the type, composition ratio, quality, and thickness of a film to be formed) to form the thin film as described above. When substrate processing is started, an appropriate process recipe may be preferably selected among the plurality of process recipes based on the details of the substrate processing. Specifically, the plurality of process recipes that are individually prepared according to the details of the substrate processing are preferably stored (installed) beforehand in the memory device 121c of the substrate processing apparatus via an electrical communication line or a recoding medium that stores the process recipes (the external memory device 123). Then, it is preferable when substrate processing is started for the CPU 121a of the substrate processing apparatus to appropriately select a program recipe among the plurality of process recipes stored in the memory device 121c according to the details of the substrate processing. Accordingly, one substrate processing apparatus is capable of commonly and reproducibly forming thin films of various types and having various composition ratios, qualities, and thicknesses. Also, substrate processing may be rapidly started while reducing a workload on an operator (e.g., when a process sequence or conditions are input, etc.) and without causing errors during the manipulation.

The present invention is not limited to cases in which process recipes are newly prepared and may be applied to, for example, a case in which process recipes installed in a substrate processing apparatus are modified. When a process recipe is modified, the modified process recipe may be installed in the substrate processing apparatus via an electrical communication line or a recording medium recording the process recipe. A process recipe installed in the substrate processing apparatus may be directly changed by manipulating the I/O device 122 of the substrate processing apparatus.

EXAMPLES

As an example of the present invention, a SiC film was formed on a plurality of substrates using the substrate processing apparatus according to the embodiment illustrated in FIG. 1, according to the film forming sequence illustrated in FIG. 4. Here, the types of process gases and a process sequence and conditions were set to be the same as those in the above embodiments. Also, as Comparative Example of the present invention, a SiC film was formed on a plurality of substrates using a substrate processing apparatus in which an inner surface of an upper end portion (ceiling portion) of an outer tube was formed in a dome shape rather than a flat shape and a top surface of a boat was not completely covered with an upper end portion of an inner tube (i.e., the top surface of the boat is fully open). Here, the types of process gases and a process sequence and conditions were set to be the same as those in the above embodiments. Then, the thicknesses of the respective SiC films formed according to Example of the present invention and Comparative Example were measured.

Figure 15A:
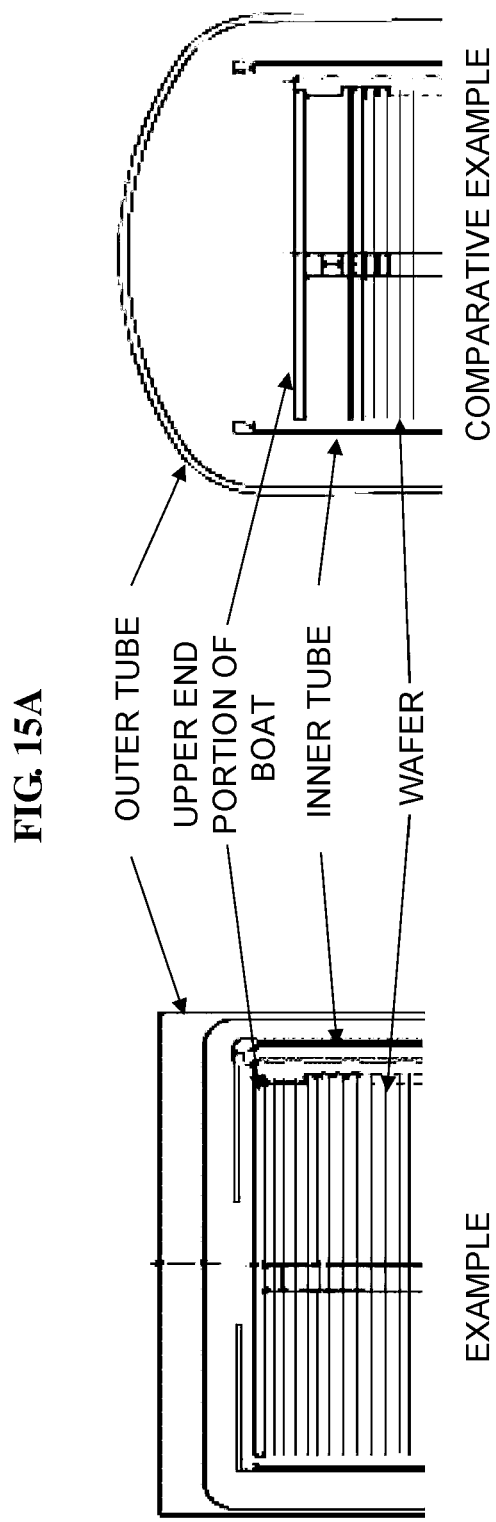
FIG. 15A is an enlarged view of portions of vertical process furnaces of substrate processing apparatuses according to Example and Comparative Example of the present invention.
Figure 15B:
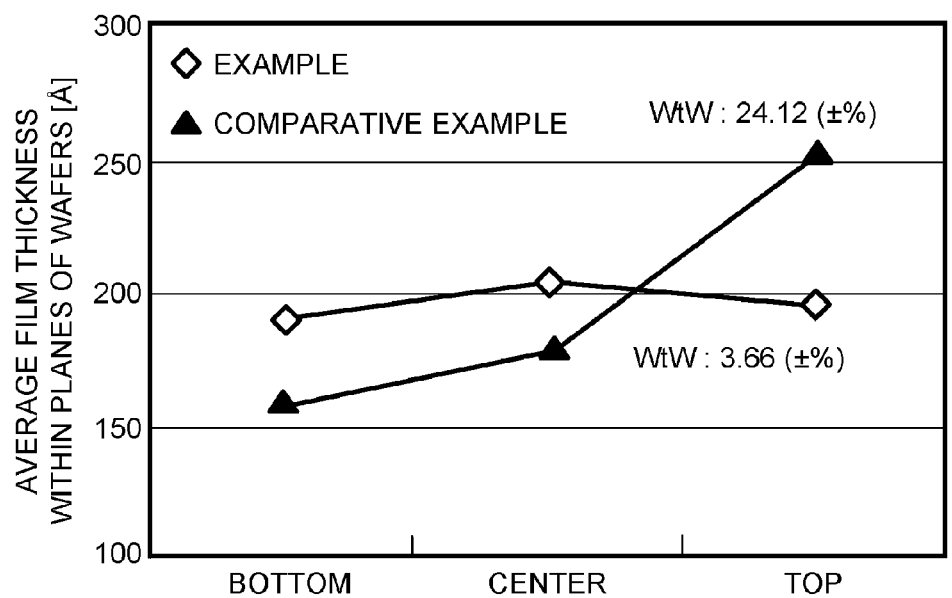
FIG. 15B is a graph illustrating a result of measuring the thicknesses of SiC films according to Example and Comparative Example of the present invention.

FIG. 15A is an enlarged view of portions of vertical process furnaces of substrate processing apparatuses according to Example and Comparative Example of the present invention. FIG. 15B is a graph illustrating a result of measuring the thicknesses of SiC films according to Example and Comparative Example of the present invention. In the graph of FIG. 15B, the horizontal axis denotes locations on a wafer region in which wafers are accommodated, and the vertical axis denotes average thicknesses (Å) of the respective SiC films within planes of wafers. In FIG. 15B, 'Bottom,' 'Center,' and 'Top' denote a lower portion, central portion, and upper portion of the wafer region, respectively. Also, '◇' denotes Example of the present invention, and '▲' denotes Comparative Example.

As illustrated in FIG. 15B, the average thicknesses of the SiC film within the planes of the wafers according to Example of the present invention were substantially the same from the upper portion Top to the lower portion Bottom, and the uniformity (WtW) of the thicknesses within the planes of the wafers was ±3.66%. In contrast, the average thicknesses of the SiC film within the planes of the wafers according to Comparative Example increased in the direction from the lower portion Bottom to the upper portion Top, and the uniformity (WtW) of the thicknesses within the planes of the wafers was ±24.12%. That is, it was concluded that the uniformity of the thicknesses of the SiC film according to Example of the present invention was far greater than that of the SiC film according to Comparative Example, within the planes of the wafers.

Additional exemplary embodiments of the present invention will now be described.

Supplementary Note 1

According to an aspect of the present invention, there is provided a method of manufacturing a semiconductor device including forming thin films on a plurality of substrates by performing a cycle a predetermined number of times, the cycle including: (a) supplying a process gas into a process container and confining the process gas in the process container in a state where the plurality of substrates arranged and supported by a support are accommodated in the process container, the process container including an outer reaction tube and an inner reaction tube disposed in the outer reaction tube, the inner reaction tube having a flat top inner surface at an upper end portion thereof covering at least a portion of a top surface of the support arranging and supporting the plurality of substrates in the inner reaction tube and including a communication section connecting an inside of the inner reaction tube to an inside of the outer reaction tube, wherein the communication section is disposed at a region other than a region horizontally encompassing a substrate arrangement region where the plurality of substrates are arranged; (b) maintaining a state where the process gas is confined in the process container; and (c) exhausting the process gas from the process container via the communication section and a space between the inner reaction tube and the outer reaction tube.

Supplementary Note 2

In the method according to supplementary note 1, it is preferable that the communication section is disposed above or below the region horizontally encompassing the substrate arrangement region.

Supplementary Note 3

In the method according to supplementary note 1 or 2, it is preferable that the communication section is disposed at one of the upper end portion of the inner reaction tube and a sidewall portion of the inner reaction tube.

Supplementary Note 4

In the method according to one of supplementary notes 1 through 3, it is preferable that the communication section is disposed at a central portion of the upper end portion of the inner reaction tube.

Supplementary Note 5

In the method according to one of supplementary notes 1 through 4, it is preferable that the communication section includes a plurality of communication portions disposed at the upper end portion of the inner reaction tube.

Supplementary Note 6

In the method according to one of supplementary notes 1 through 3, it is preferable that the support includes a plate-shaped member disposed at the top surface thereof, and the plate-shaped member faces the communication section (or closes the communication section).

Supplementary Note 7

In the method according to one of supplementary notes 1 through 6, it is preferable that the support includes a plate-shaped member disposed at the top surface thereof, and the plate-shaped member covers a surface of an uppermost one of the plurality of substrates supported by the support.

Supplementary Note 8

In the method according to one of supplementary notes 1 through 7, it is preferable that the support includes a plate-shaped member disposed at the top surface thereof, and the plate-shaped member faces the communication section and a surface of an uppermost one of the plurality of substrates supported by the support.

Supplementary Note 9

In the method according to one of supplementary notes 1 through 8, it is preferable that at least a top inner surface at an upper end portion of the outer reaction tube is flat.

Supplementary Note 10

In the method according to one of supplementary notes 1 through 9, it is preferable that the upper end portion of the inner reaction tube is parallel to an upper end portion of the outer reaction tube.

Supplementary Note 11

In the method according to one of supplementary notes 1 through 10, it is preferable that an upper end portion of the outer reaction tube, the upper end portion of the inner reaction tube and the top surface of the support are parallel to one another.

Supplementary Note 12

In the method according to one of supplementary notes 1 through 11, it is preferable that an upper end portion of the outer reaction tube, the upper end portion of the inner reaction tube, the top surface of the support and surfaces of the plurality of substrates are parallel to one another.

Supplementary Note 13

In the method according to one of supplementary notes 1 through 3, it is preferable that the support arranges and supports a plurality of insulating plates, and the communication section is disposed in a region horizontally encompassing an insulating plate arrangement region where the plurality of insulating plates are arranged.

Supplementary Note 14

In the method according to one of supplementary notes 1 through 13, it is preferable that the forming of the thin films includes heating an inside of the process container to a thermal decomposition temperature of the process gas.

Supplementary Note 15

In the method according to one of supplementary notes 1 through 14, it is preferable that the forming of the thin films is performed in a non-plasma atmosphere.

Supplementary Note 16

In the method according to one of supplementary notes 1 through 15, it is preferable that, the forming of the thin films includes alternately performing a predetermined number of times the act of alternately performing a predetermined number of times (a) confining the process gas in the process container and (b) maintaining the state where the process gas is confined in the process container; and the act of (c) exhausting the process gas from the process container.

If a cycle includes (a) confining the process gas in the process container and (b) maintaining the state where the process gas is confined in the process container, "alternately performing a predetermined number of times (a) confining the process gas in the process container and (b) maintaining the state where the process gas is confined in the process container" includes a case of performing the cycle once and a case of performing the cycle a plurality of times (repeating the cycle a plurality of times), which means that the cycle is performed at least once (once or a plurality of times). Similarly, if a cycle includes the act of alternately performing a predetermined number of times (a) confining the process gas in the process container and (b) maintaining the state where the process gas is confined in the process container, and the act of (c) exhausting the process gas from the process container, "alternately performing a predetermined number of times the act of alternately performing a predetermined number of times (a) confining the process gas in the process container and (b) maintaining the state where the process gas is confined in the process container; and the act of (c) exhausting the process gas from the process container" includes a case of performing the cycle once and a case of performing the cycle a plurality of times (repeating the cycle a plurality of times), which means that the cycle is performed at least once (once or a plurality of times).

Supplementary Note 17

In the method according to one of supplementary notes 1 through 16, it is preferable that the forming of the thin films includes repeating a cycle a plurality of times, the cycle including: (a) confining the process gas in the process container; (b) maintaining the state where the process gas is confined in the process container; and (c) exhausting the process gas from the process container.

Supplementary Note 18

In the method according to one of supplementary notes 1 through 16, it is preferable that the forming of the thin films includes repeating a cycle a plurality of times, the cycle including: the act of alternately repeating a predetermined number of times (a) confining the process gas in the process container and (b) maintaining the state where the process gas is confined in the process container; and the act of (c) exhausting the process gas from the process container.

Supplementary Note 19

In the method according to one of supplementary notes 1 through 18, it is preferable that the forming of the thin films includes: thermally decomposing the process gas supplied into the process chamber; and causing chemical reactions among materials generated by thermally decomposing the process gas in the state where the process gas is confined in the process chamber to react with one another, and forming the thin films by the chemical reactions.

Supplementary Note 20

In the method according to one of supplementary notes 1 through 19, it is preferable that the exhausting of the process container is suspended in confining the process gas in the process chamber and maintaining the state where the process gas is confined in the process chamber.

Supplementary Note 21

In the method according to one of supplementary notes 1 through 19, it is preferable that, in confining the process gas in the process chamber and maintaining the state where the process gas is confined in the process chamber, the process gas is exhausted from the process container while the process gas is supplied into the process container, wherein an exhaust rate of the process gas exhausted from the process container is maintained to be less than a supply rate of the process gas supplied into the process container.

Supplementary Note 22

According to another aspect of the present invention, there is provided a substrate processing apparatus including: a process container including: an outer reaction tube; and an inner reaction tube disposed in the outer reaction tube, the inner reaction tube having a flat top inner surface at an upper end portion thereof covering at least a portion of a top surface of the support arranging and supporting the plurality of substrates in the inner reaction tube and including a communication section connecting an inside of the inner reaction tube to an inside of the outer reaction tube, wherein the communication section is disposed at a region other than a region horizontally encompassing a substrate arrangement region where the plurality of substrates are arranged; a process gas supply system configured to supply a process gas into the process container; an exhaust system configured to exhaust the process gas from the process container via the communication section and a space between the inner reaction tube and the outer reaction tube; and a control unit configured to control the process gas supply system and the exhaust system to form thin films on the plurality of substrates by performing a cycle a predetermined number of times, the cycle including: (a) supplying the process gas into the process container and confining the process gas in the process container in a state where the plurality of substrates arranged and supported by the support are accommodated in the process container; (b) maintaining a state where the process gas is confined in the process container; and (c) exhausting the process gas from the process container via the communication section and the space between the inner reaction tube and the outer reaction tube.

Supplementary Note 23

According to still another aspect of the present invention, there is provided a non-transitory computer readable recording medium storing a program that causes a computer to perform a process of forming thin films on a plurality of substrates by performing a cycle a predetermined number of times, the cycle including: (a) supplying a process gas into a process container and confining the process gas in the process container in a state where the plurality of substrates arranged and supported by a support are accommodated in the process container, the process container including an outer reaction tube and an inner reaction tube disposed in the outer reaction tube, the inner reaction tube having a flat top inner surface at an upper end portion thereof covering at least a portion of a top surface of the support supporting the plurality of substrates in the inner reaction tube and including a communication section connecting an inside of the inner reaction tube to an inside of the outer reaction tube, wherein the communication section is disposed at a region other than a region horizontally encompassing a substrate arrangement region where the plurality of substrates are arranged; (b) maintaining a state where the process gas is confined in the process container; and (c) exhausting the process gas from the process container via the communication section and a space between the inner reaction tube and the outer reaction tube.

What is claimed is:

1. A method of manufacturing a semiconductor device comprising forming thin films on a plurality of substrates by performing a cycle a predetermined number of times, the cycle comprising:
  (a) supplying a process gas into a process container and confining the process gas in the process container with the plurality of substrates arranged and supported by a support being accommodated in the process container, the process container comprising an outer reaction tube and an inner reaction tube disposed in the outer reaction tube, the outer reaction tube having at least a flat top inner surface at an upper end portion thereof, and the inner reaction tube having a flat top inner surface at an upper end portion thereof covering at least a portion of a top surface of the support arranging and supporting the plurality of substrates in the inner reaction tube and including a communication section connecting an inside of the inner reaction tube to an inside of the outer reaction tube, wherein the communication section is disposed at a region other than a region horizontally encompassing a substrate arrangement region where the plurality of substrates are arranged;
  (b) maintaining a state where the process gas is confined in the process container; and
  (c) exhausting the process gas from the process container via the communication section and a space between the inner reaction tube and the outer reaction tube.

2. The method according to claim 1, wherein the communication section is disposed above or below the region horizontally encompassing the substrate arrangement region.

3. The method according to claim 1, wherein the communication section is disposed at one of the upper end portion of the inner reaction tube and a sidewall portion of the inner reaction tube.

4. The method according to claim 1, wherein the communication section is disposed at a central portion of the upper end portion of the inner reaction tube.

5. The method according to claim 1, wherein the communication section comprises a plurality of communication portions disposed at the upper end portion of the inner reaction tube.

6. The method according to claim 1, wherein the support comprises a plate-shaped member disposed at the top surface thereof, and the plate-shaped member faces the communication section.

7. The method according to claim 1, wherein the support comprises a plate-shaped member disposed at the top surface thereof, and the plate-shaped member covers a surface of an uppermost one of the plurality of substrates supported by the support.

8. The method according to claim 1, wherein the support comprises a plate-shaped member disposed at the top surface thereof, and the plate-shaped member faces the communication section and a surface of an uppermost one of the plurality of substrates supported by the support.

9. The method according to claim 1, wherein the upper end portion of the inner reaction tube is parallel to an upper end portion of the outer reaction tube.

10. The method according to claim 1, wherein an upper end portion of the outer reaction tube, the upper end portion of the inner reaction tube and the top surface of the support are parallel to one another.

11. The method according to claim 1, wherein an upper end portion of the outer reaction tube, the upper end portion of the inner reaction tube, the top surface of the support and surfaces of the plurality of substrates are parallel to one another.

12. The method according to claim 1, wherein the support arranges and supports a plurality of insulating plates, and the communication section is disposed in a region horizontally encompassing an insulating plate arrangement region where the plurality of insulating plates are arranged.

13. The method according to claim 1, wherein the forming of the thin films comprises heating an inside of the process container to a thermal decomposition temperature of the process gas.

14. The method according to claim 1, wherein the forming of the thin films is performed in a non-plasma atmosphere.

15. The method according to claim 1, wherein the upper end portion of the outer reaction tube is formed to be thicker than a sidewall portion of the outer reaction tube.

16. A non-transitory computer readable recording medium storing a program that causes a computer to perform a process of forming thin films on a plurality of substrates by performing a cycle a predetermined number of times, the cycle comprising:
  (a) supplying a process gas into a process container and confining the process gas in the process container with the plurality of substrates arranged and supported by a support being accommodated in the process container, the process container comprising an outer reaction tube and an inner reaction tube disposed in the outer reaction tube, the outer reaction tube having at least a flat top inner surface at an upper end portion thereof, and the inner reaction tube having a flat top inner surface at an upper end portion thereof covering at least a portion of a top surface of the support arranging and supporting the plurality of substrates in the inner reaction tube and including a communication section connecting an inside of the inner reaction tube to an inside of the outer reaction tube, wherein the communication section is disposed at a region other than a region horizontally encompassing a substrate arrangement region where the plurality of substrates are arranged;
  (b) maintaining a state where the process gas is confined in the process container; and
  (c) exhausting the process gas from the process container via the communication section and a space between the inner reaction tube and the outer reaction tube.

17. The computer readable recording medium according to claim 16, wherein the upper end portion of the outer reaction tube is formed to be thicker than a sidewall portion of the outer reaction tube.

* * * * *